(12) United States Patent
Onishi et al.

(10) Patent No.: US 7,873,090 B2
(45) Date of Patent: Jan. 18, 2011

(54) SURFACE EMITTING LASER, PHOTODETECTOR AND OPTICAL COMMUNICATION SYSTEM USING THE SAME

(75) Inventors: Toshikazu Onishi, Kyoto (JP); Tetsuzo Ueda, Osaka (JP); Daisuke Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 98 days.

(21) Appl. No.: 11/519,973

(22) Filed: Sep. 13, 2006

(65) Prior Publication Data

US 2007/0058982 A1   Mar. 15, 2007

(30) Foreign Application Priority Data

Sep. 13, 2005  (JP) .............. 2005-264793
Feb. 24, 2006  (JP) .............. 2006-047745

(51) Int. Cl.
*H01S 5/068* (2006.01)
*H01S 5/183* (2006.01)
*H01S 5/02* (2006.01)
*H01S 5/42* (2006.01)

(52) U.S. Cl. ........... 372/50.12; 372/29.02; 372/50.124; 372/106; 398/65; 398/140; 398/152

(58) Field of Classification Search ............ 398/140, 398/152, 65; 372/29.02, 50.12, 50.124, 106
See application file for complete search history.

(56) References Cited

U.S. PATENT DOCUMENTS

| 4,987,607 | A | * | 1/1991 | Gilbreath et al. ............ 398/119 |
| 5,331,654 | A | * | 7/1994 | Jewell et al. ............. 372/45.01 |
| 6,055,262 | A | * | 4/2000 | Cox et al. ..................... 372/96 |
| 6,646,774 | B1 | * | 11/2003 | Willner et al. .............. 359/246 |
| 7,061,956 | B2 | * | 6/2006 | Eitel .......................... 372/50.1 |
| 2002/0009258 | A1 | * | 1/2002 | Coldren et al. ................ 385/24 |
| 2006/0209413 | A1 | * | 9/2006 | Kim et al. .................... 359/577 |

FOREIGN PATENT DOCUMENTS

JP   6-196814 A   7/1994
JP   2003-124913 A   4/2003

OTHER PUBLICATIONS

T Thio, H. Ghaemi, H. Lezec, P. Wolff, T. Ebbesen, "Surface-plasmon-enhanced transmission through hole arrays in Cr films," J. Opt. Soc. Am. B vol. 16, 1743-1748 (1999).*

* cited by examiner

*Primary Examiner*—Minsun Harvey
*Assistant Examiner*—Michael Carter
(74) *Attorney, Agent, or Firm*—McDermott Will & Emery LLP

(57) ABSTRACT

A surface emitting laser includes a plurality of light-emitting portions for emitting laser light beams in different linearly polarized light directions. The light-emitting portions are formed on the substrate and located close to each other. The light-emitting portions include metal opening arrays through which light beams in different linearly polarized light directions respectively pass.

18 Claims, 14 Drawing Sheets

SURFACE EMITTING LASER, PHOTODETECTOR AND OPTICAL COMMUNICATION SYSTEM USING THE SAME

CROSS-REFERENCE TO RELATED APPLICATION

This application claims priority under 35 U.S.C. 119 on Patent Application No. 2005-264793 filed in Japan on Sep. 13, 2005 and No. 2006-047745 filed in Japan on Feb. 24, 2006, the entire contents of which are hereby incorporated by reference. The entire contents of Patent Application No. 2006-184859 filed in Japan on Jul. 4, 2006 are also incorporated by reference.

BACKGROUND OF THE INVENTION

1. Field of the Invention

The present invention relates to surface emitting lasers and photodetectors for use in optical communication with polarization division multiplexing and optical communication systems using the lasers and the photodetectors.

2. Description of the Related Art

To meet with recent increase of an information communication demand, increases of communication speed and communication capacity are urgently needed. Accordingly, modulation bandwidths of elements for mutually converting electrical signals and optical signals in, for example, a laser in a transmitting unit and a photodetector in a receiving unit are increased and transmission capacity is increased by adopting a communication scheme such as wavelength multiplexing or polarization division multiplexing. The polarization division multiplexing with which optical signals in different polarization states are transmitted at a time using one optical fiber allows the number of channels to be increased to a number corresponding to the number of polarization states and enables increase of communication capacity.

As a means of generating a polarization multiplexed optical signal, the following example is disclosed in Japanese Unexamined Patent Publication No. 2003-124913. As illustrated in FIG. 19, outputs of two lasers are coupled to respective polarization-preserving optical fibers, and the two polarization-preserving optical fibers are connected to the input ends of a polarization multiplexing prism 201 such that polarization directions are orthogonal to each other. A signal transmitted to the optical fiber from the output end of the polarization multiplexing prism 201 becomes a polarization multiplexed optical signal including optical signals in two polarization states in which polarization directions are orthogonal to each other.

In the conventional configuration, however, the polarization multiplexing prism, two polarization-preserving optical fibers provided at the input ends and one polarization-preserving optical fiber provided on the output end are necessary as a means of generating a polarization multiplexed optical signal. This causes the problems of increase in the number of parts, increase in the size of a system and increase in cost.

In addition, a coupling unit for coupling the prism and the optical fibers is also needed, so that long-distance communication becomes difficult because of a coupling loss. Moreover, the two optical fibers need to be coupled to the prism such that the polarization directions are orthogonal to each other. Accordingly, a number of processes enough to adjust, for example, the positions of the optical fibers and the coupling angles between the optical fibers and the prism are needed, so that cost reduction is difficult.

In the case of receiving a polarization multiplexed optical signal in multiple channels, it is necessary to provide analyzers and photodetectors in a number corresponding to the number of the polarization states included in the polarization multiplexed optical signal, so that a receiving unit needs to be simplified. In addition, the polarization multiplexed signal needs to be divided using, for example, a prism, resulting in a decrease of signal intensity. As a result, the problem of decrease of the S/N ratio and other problems arise.

SUMMARY OF THE INVENTION

It is therefore an object of the present invention to provide a surface emitting laser capable of emitting a polarization multiplexed optical signal using a small number of parts without the need for complicated adjustment processes, a photodetector for detecting signals with a plurality of channels included in the polarization multiplexed optical signal and an optical communication system for polarization division multiplexing.

To achieve the object, according to the present invention, a surface emitting laser is configured to emit a plurality of laser light beams in different polarization directions.

Specifically, a surface emitting laser according to the present invention includes a plurality of light-emitting portions for emitting laser light in different linearly polarized light directions, and the light-emitting portions are formed on a substrate and located close to each other.

Since the surface emitting laser includes a plurality of light-emitting portions for emitting laser light in different linearly polarized light directions, a plurality of laser light beams in different linearly polarized light directions are obtained without addition of parts. In addition, since a plurality of light-emitting portions are closely located, it is possible to directly couple laser light beams from the respective light-emitting portions to one optical fiber. Accordingly, polarization multiplexed optical signal light is obtained without using, for example, a polarization multiplexing prism, so that no coupling loss between the optical fiber and a prism occurs. Moreover, the coupling angle between the optical fiber and a prism does not need to be adjusted. As a result, a surface emitting laser capable of being used for optical communication with polarization multiplexing using a small number of parts without the need for complicated adjustment processes is implemented.

In the surface emitting laser, the light-emitting portions are preferably formed within a region having a diameter of 100 µm. With this configuration, laser light beams emitted from the respective light-emitting portions are directly coupled to a general optical fiber for communication.

In the surface emitting laser, it is preferable that the light-emitting portions include respective metal opening arrays each including a metal layer and provided at a light-emitting surface of the light-emitting portion, the metal layer includes a plurality of openings arranged at regular intervals in such a manner that the directions of the respective openings orthogonal to longitudinal directions thereof are oriented in a direction, each of the openings has a shape having a width in the direction orthogonal to the longitudinal direction equal to or smaller than an oscillation wavelength of the laser light, and the directions of the metal opening arrays orthogonal to the longitudinal directions differ from one another.

In this configuration, the openings are arranged at regular intervals in the metal layers, so that surface plasmon resonance occurs between the laser light and the metal layer, thus making it possible to emit the laser light to outside the laser through the metal layer. In addition, the shape of the openings has isotropy, so that direction dependence occurs in the surface plasmon resonance and light transmittance is enhanced with respect to only one direction. Accordingly, a light beam emitted in a given linearly polarized light direction is obtained. Moreover, the openings are arranged in such a manner that the minor axes of the openings are oriented in one direction in each of the light-emitting portions. The direction of the minor axis differs among the light-emitting portions. Accordingly, light beams in different linearly polarized light directions are emitted from the respective light-emitting portions.

In the surface emitting laser, each of the openings preferably has a shape of one of an ellipse and a rectangular. With this configuration, emitted light having a high polarization ratio and a high output is obtained.

In the surface emitting laser, it is preferable that the openings are arranged to form a square lattice, and P satisfies a relationship:

$$0.9 \times P \leq \lambda \times (i^2+j^2)^{1/2}/(\in_1 \in_2/(\in_1+\in_2))^{1/2} \leq 1.1 \times P$$

where P is a lattice pitch of the openings, $\in_1$ is a dielectric constant of the metal layer, $\in_2$ is a dielectric constant of a medium in contact with one of an upper surface and a lower surface of the metal layer, $\lambda$ is an oscillation wavelength of the laser light, and i and j are integers which are not negative. This configuration ensures occurrence of surface plasmon resonance in the metal layers.

In the surface emitting laser, it is preferable that the openings are arranged to form a lattice in the metal layer, and the direction of the lattice coincides with the longitudinal direction. The direction of the lattice may coincide with the direction orthogonal to the longitudinal direction. In this case, it is preferable that each of the openings has a shape of one of an ellipse and a rectangular, and the lattice is a hexagonal lattice. With this configuration, the linearly polarized light direction is controlled to the direction of arrangement of the openings which coincides with the longitudinal direction of the openings or the direction orthogonal to the longitudinal direction. Accordingly, emitted light having a particularly high polarization ratio is obtained.

In the surface emitting laser, it is preferable that the light-emitting portions include respective metal opening arrays each including a metal layer and provided at a light-emitting surface of the light-emitting portion, the metal layer includes a plurality of openings arranged at regular intervals and each having a diameter equal to or smaller than an oscillation wavelength of the laser light, the openings are arranged to form a rectangular lattice having two different lattice pitches, and the lattice direction of the rectangular lattice differs among the metal opening arrays.

In this case, one of the two lattice pitches preferably satisfies a surface plasmon resonance condition with respect to the laser light. It is also preferable that P satisfies a relationship:

$$0.9 \times P \leq \lambda \times (i^2+j^2)^{1/2}/(\in_1 \in_2/(\in_1+\in_2))^{1/2} \leq 1.1 \times P$$

where P is one of the two lattice pitches, $\in_1$ is a dielectric constant of the metal layer, $\in_2$ is a dielectric constant of a medium in contact with one of an upper surface and a lower surface of the metal layer, $\lambda$ is an oscillation wavelength of the laser light, and i and j are integers which are not negative. With this configuration, a light beam which is linearly polarized in a direction satisfying the surface plasmon resonance condition is emitted from each of the light-emitting portions. In addition, since the direction of arrangement of the openings differs among the light-emitting portions, it is possible to obtain emitted light beams in different linearly polarized light directions from the respective light-emitting portions.

In the surface emitting laser, it is preferable that the light-emitting portions include respective metal opening arrays each including a metal layer and provided at a light-emitting surface of the light-emitting portion, the metal layer includes a plurality of openings arranged at regular intervals and each having the shape of a stripe having a width equal to or smaller than an oscillation wavelength of the laser light, and the stripes extend in different directions among the metal opening arrays. With this configuration, a linearly polarized light beam in a direction orthogonal to the direction along which the stripes extend is emitted from each of the light-emitting portions. In addition, since the stripe direction differs among the light-emitting portions, light beams emitted in different linearly polarized light directions are obtained from regions which are closely located.

In the surface emitting laser, it is preferable that the substrate has a semi-insulating property, and the light-emitting portions are formed in respective regions which are electrically isolated from one another by a trench formed in the substrate. In this case, it is preferable that each of the light-emitting portions includes: a stack of a plurality of semiconductor layers formed on the substrate; and two electrodes for applying a voltage to the stack of semiconductor layers, and the two electrodes are formed at one side of the substrate. This configuration prevents an electrical crosstalk between the light-emitting portions, thus obtaining a surface emitting laser in which the polarization plane is stabilized in each light-emitting portion.

A photodetector according to the present invention includes; a substrate; and a plurality of light-receiving portions formed on the substrate and located close to each other, wherein each of the light-receiving portions detects, as detected light, light in different linearly polarized light directions out of light incident on light-receiving surfaces of the respective light-receiving portions.

The photodetector includes a plurality of light-receiving portions for detecting, as detected light, light beams in different linearly polarized light directions out of light incident on the light-receiving surface. Accordingly, a signal in multiple channels in a polarization multiplexed optical signal in multiple channels is detected by one photodetector. In addition, since the light-receiving portions are closely located, the light-receiving portions are allowed to be directly coupled to an optical fiber. Accordingly, the configuration of a receiver in a polarization multiplexed optical communication system is simplified.

In the photodetector, the light-receiving portions are preferably formed within a region having a diameter of 100 μm. With this configuration, it is possible to directly couple the photodetector to the optical fiber.

In the photodetector, it is preferable that the light-receiving portions include respective metal opening arrays each including a metal layer and provided at the light-receiving surface of the light-receiving portion, the metal layer includes a plurality of openings arranged at regular intervals in such a manner that the directions of the respective openings orthogonal to longitudinal directions thereof are oriented in a direction, each of the openings has a shape with a width in the direction orthogonal to the longitudinal direction equal to or smaller than an oscillation wavelength of the laser light, and the directions of the metal opening arrays orthogonal to the longitudinal directions differ from one another. This configuration enables the light-receiving portions to detect light beams in different linearly polarized light directions. In addition, since the metal opening array serves as a filter to light wavelength, the system is not affected by unnecessary light other than a signal. Accordingly, an optical communication system with a high precision is implemented.

In the photodetector, each of the openings preferably has a shape of one of an ellipse and a rectangular.

In the photodetector, it is preferable that the openings are arranged to form a square lattice, and P satisfies a relationship:

$$0.9 \times P \leq \lambda \times (i^2+j^2)^{1/2}/(\in_1\in_2/(\in_1+\in_2))^{1/2} \leq 1.1 \times P$$

where P is a lattice pitch of the openings, $\in_1$ is a dielectric constant of the metal layer, $\in_2$ is a dielectric constant of a medium in contact with one of an upper surface and a lower surface of the metal layer, $\lambda$ is an oscillation wavelength of the detected light, and i and j are integers which are not negative. With this configuration, surface plasmon resonance is utilized, so that it is possible to enhance the sensitivity of the device or reduce the size of the device.

In the photodetector, it is preferable that the openings are arranged to form a lattice in the metal layer, and the direction of the lattice coincides with the longitudinal direction. The direction of the lattice may coincide with the direction orthogonal to the longitudinal direction.

In the photodetector, it is preferable that each of the openings has a shape of one of an ellipse and a rectangular, and the lattice is a hexagonal lattice.

In the photodetector, it is preferable that the light-receiving portions include respective metal opening arrays each including a metal layer and provided at the light-receiving surface of the light-receiving portion, the metal layer includes a plurality of openings arranged at regular intervals and each having a diameter equal to or smaller than an oscillation wavelength of the laser light, the openings are arranged to form a rectangular lattice having two different lattice pitches, and the lattice direction of the rectangular lattice differs among the metal opening arrays.

In this case, one of the two lattice pitches preferably satisfies a surface plasmon resonance condition with respect to the detected light. It is also preferable that P satisfies a relationship:

$$0.9 \times P \leq \lambda \times (i^2+j^2)^{1/2}/(\in_1\in_2/(\in_1+\in_2))^{1/2} \leq 1.1 \times P$$

where P is one of the two lattice pitches, $\in_1$ is an dielectric constant of the metal layer, $\in_2$ is a dielectric constant of a medium in contact with one of an upper surface and a lower surface of the metal layer, $\lambda$ is an oscillation wavelength of the laser light, and i and j are integers which are not negative.

In the photodetector, it is preferable that the light-receiving portions include respective metal opening arrays each including a metal layer and provided at the light-receiving surface of the light-receiving portion, the metal layer includes a plurality of openings arranged at regular intervals and each having the shape of a stripe having a width equal to or smaller than an oscillation wavelength of the detected light, and the stripes extend in different directions among the metal opening arrays.

In the photodetector, it is preferable that the substrate has a semi-insulating property, and the light-receiving portions are formed in respective regions which are electrically isolated from one another by a trench formed in the substrate. In this case, it is preferable that each of the light-receiving portions is a photodiode formed on the substrate and including two electrodes, and the two electrodes are formed at one side of the substrate. This configuration enables the photodetector to operate at high speed.

An optical communication system according to the present invention includes: a transmitter including the surface emitting laser of the present invention and configured to output a polarization multiplexed optical signal in multiple channels composed of a plurality of laser light beams in different linearly polarized light directions emitted from respective light-emitting portions of the surface emitting laser; and a receiver for detecting the polarization multiplexed optical signal in multiple channels with the polarization multiplexed optical signal being divided into portions corresponding to the respective channels.

The optical communication system of the present invention includes a surface emitting laser and a transmitter for outputting a polarization multiplexed optical signal in which a plurality of laser light beams in different linearly polarized light directions emitted from respective light-emitting portions of the surface emitting laser are used as channels. Accordingly, polarization multiplexed communication is achieved with a simple configuration, so that a large-capacity data communication is performed at low cost.

In the optical communication system, the receiver preferably includes the photodetector. With this configuration, the configuration of the receiver is also simplified.

In the optical communication system, the receiver preferably includes: an analyzer rotatably provided and allowing only a light beam in a specific linearly polarized light direction to pass therethrough depending on an angle of rotation; and a light-receiving portion for detecting the light beam which has passed through the analyzer. With this configuration, polarization multiplexed optical communication with time division is achieved with a simple configuration. In this case, it is preferable that the analyzer includes a metal opening array including a metal film, and a plurality of openings each having a width in a direction orthogonal to a longitudinal direction equal to or smaller than a wavelength of the polarization multiplexed optical signal are formed in the metal film in such a manner that the directions of the respective openings orthogonal to the longitudinal directions thereof are oriented in one direction.

The optical communication system preferably further includes an optical fiber for transmitting the polarization multiplexed optical signal to the receiver with the linearly polarized light directions of the polarization multiplexed optical signal preserved. In this case, a plurality of laser light beams emitted from the respective light-emitting portions are preferably directly coupled to the optical fiber. With this configuration, no coupling loss between the optical fiber and a prism occurs. In addition, adjustment of the coupling angle between the optical fiber and a prism is unnecessary.

In the optical communication system, the polarization multiplexed optical signal is preferably transmitted to the receiver by space transmission. With this configuration, within a visible range, polarization multiplexed optical communication is easily performed. Unlike the case of using an optical fiber, the spatial direction does not vary, so that a correspondence between the transmitter and the receiver is easily defined.

In this case, the optical communication system preferably further includes a lens for focusing the polarization multiplexed optical signal output from the transmitter. With this configuration, spatial expansion of emitted light is suppressed, thus making it possible to increase the communication distance.

BRIEF DESCRIPTION OF THE DRAWINGS

FIG. 10A is a plan view. FIG. 10 is a cross-sectional view taken along the line Xa-Xa in FIG. 10A.

FIG. 13A is a plan view corresponding to FIG. 2. FIG. 13B is a cross-sectional view corresponding to FIG. 4.

FIG. 14A is a view for explaining a relationship between the angle of a polarizing plate and the lattice direction of a metal opening array. FIG. 14B is a graph showing measurement results.

DETAILED DESCRIPTION OF THE INVENTION

Embodiment 1

Figure 1:
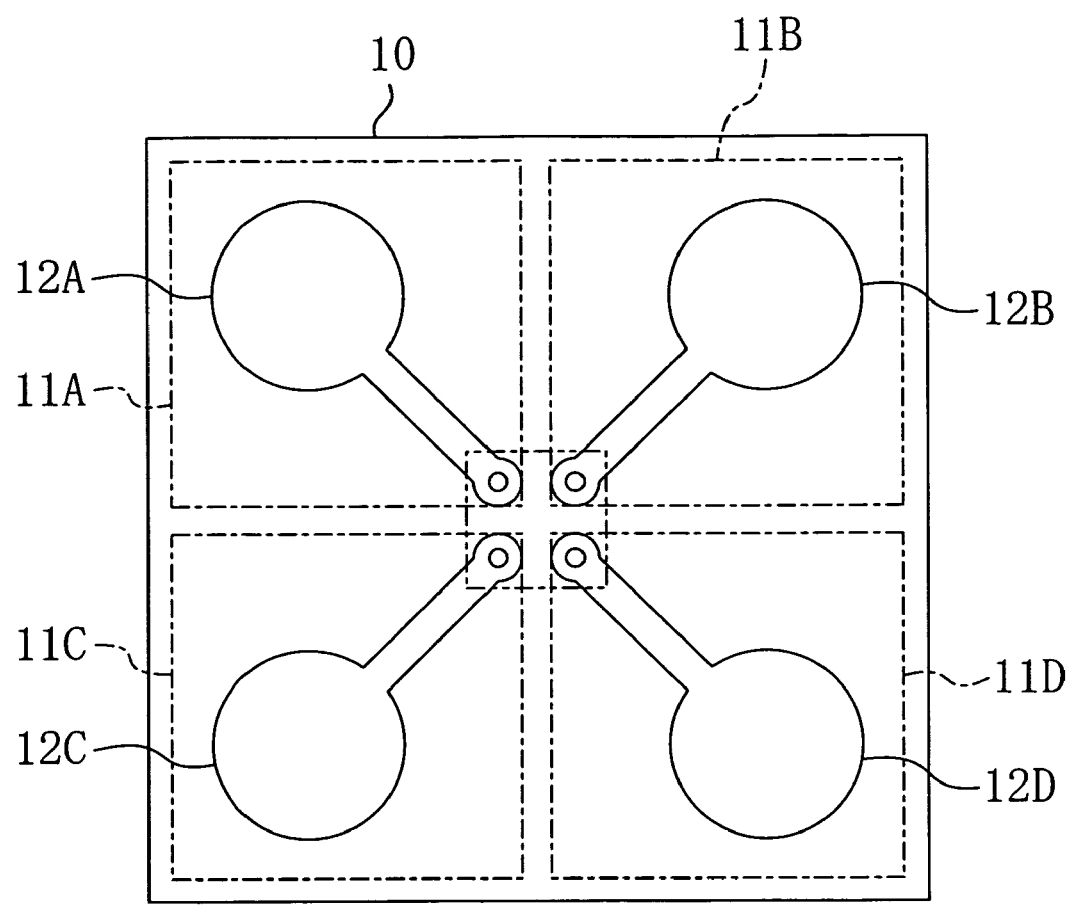
FIG. 1 is a plan view illustrating a surface emitting laser according to a first embodiment of the present invention.
Figure 2:
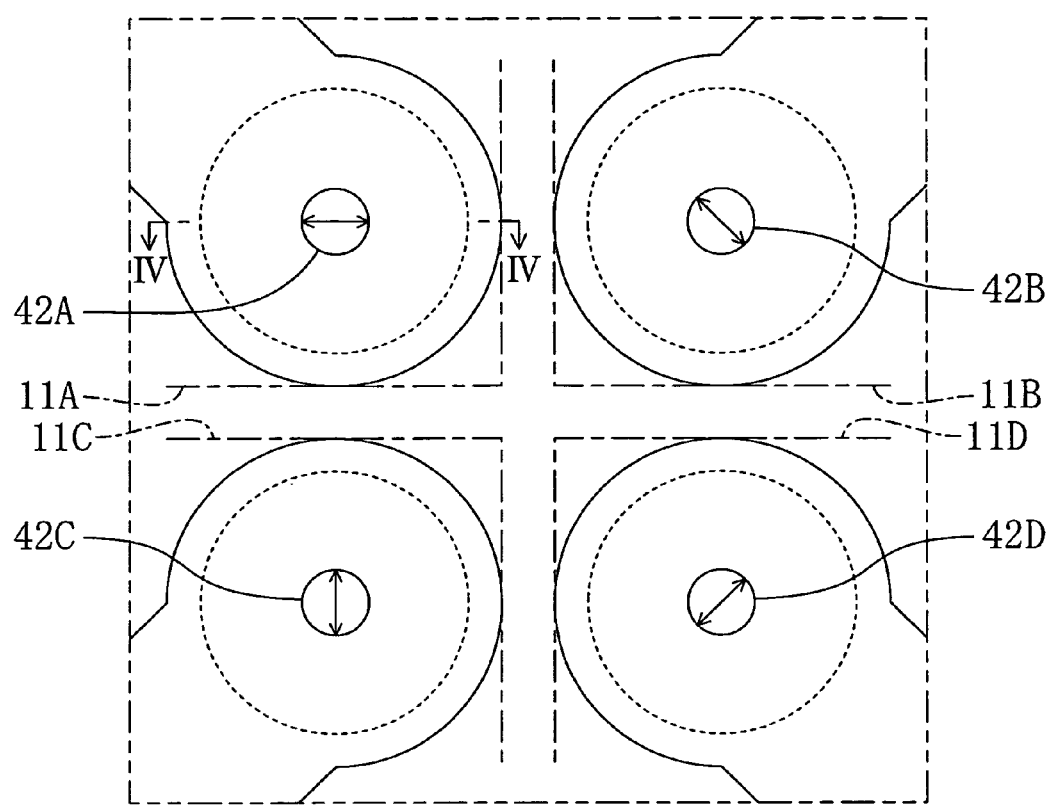
FIG. 2 is a plan view illustrating a main portion of the surface emitting laser of the first embodiment.

A first embodiment of the present invention will be described with reference to the drawings. FIG. 1 is a plan view illustrating a configuration of a surface emitting laser according to the first embodiment. FIG. 2 illustrates an area of FIG. 1 enclosed by a chain double-dashed line in an enlarged manner. In FIG. 2, each double-headed arrow indicates the direction of a linearly polarized light beam emitted from each light-emitting portion.

As illustrated in FIG. 1, the surface emitting laser of this embodiment includes four light-emitting portions: a light-emitting portion 11A, a light-emitting portion 11B, a light-emitting portion 11C and a light-emitting portion 11D, formed on a substrate 10. Each light-emitting portion is herein a vertical cavity surface emitting laser (VCSEL). The light-emitting portions 11A through 11D include an upper electrode 12A, an upper electrode 12B, an upper electrode 12C and an upper electrode 12D, respectively, and are capable of being driven independently of each other.

As illustrated in FIG. 2, laser light beams emitted from the respective light-emitting portions are in different linearly polarized light directions. Accordingly, it is possible to convert electrical signals in four systems into respective laser light signals in different linearly polarized light directions.

Figure 3:
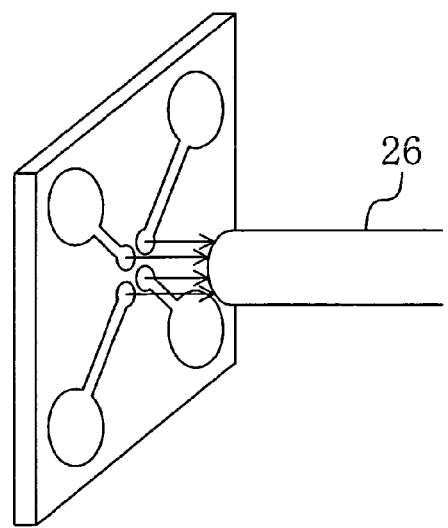
FIG. 3 is a perspective view illustrating an optical communication system using the surface emitting laser of the first embodiment.

FIG. 3 illustrates an optical communication system using the surface emitting laser of the first embodiment. As illustrated in FIG. 3, the light-emitting portions are closely located, so that light beams from the respective light-emitting portions are directly coupled to one optical fiber 26. In this embodiment, the interval between adjacent light-emitting portions is set at 30 µm, so that it is possible to directly couple all the light-emitting portions to a general multimode fiber having a core diameter of 50 µm. That is, it is possible to directly couple four types of laser light signals in different linearly polarized light directions to one optical fiber so as to transmit the signals in polarization multiplexed states. The arrows in FIG. 3 represent laser light beams emitted from the respective light-emitting portions.

In the surface-emitting laser of this embodiment, it is unnecessary to use an optical element such as a prism in coupling laser light beams emitted from the light-emitting portions to the optical fiber, so that substantially no coupling loss occurs. It is also unnecessary to adjust the coupling angle between a prism and the optical fiber.

Figure 4:
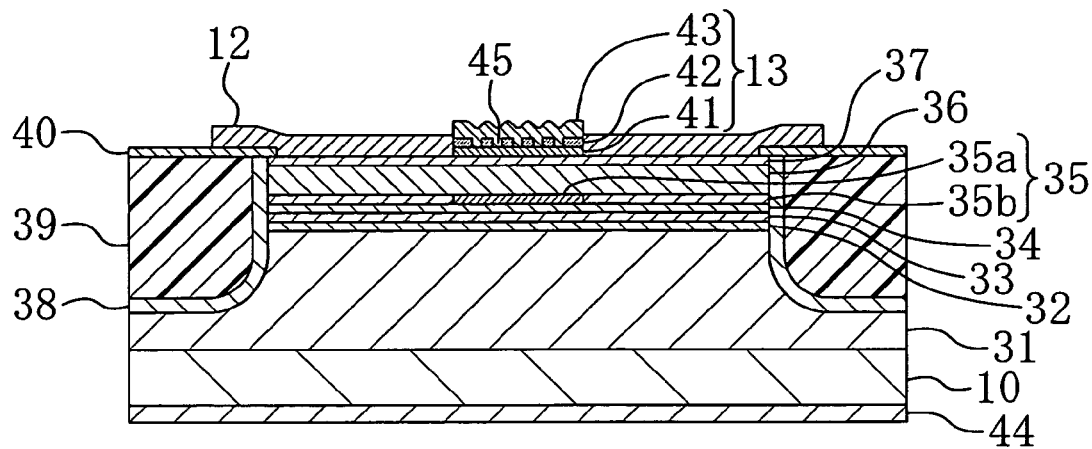
FIG. 4 is a cross-sectional view illustrating the surface emitting laser of the first embodiment taken along the line VI-VI in FIG. 2.

Now, a configuration of the surface-emitting laser of this embodiment and a principle of operation thereof will be specifically described. FIG. 4 illustrates a cross-sectional structure taken along the line IV-IV in FIG. 2. As illustrated in FIG. 4, in the surface-emitting laser of the first embodiment, an n-type lower multilayer reflector 31 is formed on a substrate 10 made of n-type gallium arsenide (GaAs). The n-type lower multilayer reflector 31 is a multilayer film formed by alternately stacking n-type $Al_{0.12}Ga_{0.88}As$ layers and n-type $Al_{0.90}Ga_{0.10}As$ layers. The thickness of each layer is $\lambda/4n$ (where $\lambda$ is a laser oscillation wavelength and n is a refractive index of a medium). In the n-type lower multilayer reflector 31, 34.5 pairs of the n-type $Al_{0.12}Ga_{0.88}As$ layers and the n-type $Al_{0.90}Ga_{0.10}As$ layers are stacked. These layers are doped with silicon as an n-type impurity.

A lower spacer layer 32, a quantum well layer 33, and an upper spacer layer 34 made of $Al_{0.30}Ga_{0.70}As$ are stacked on the n-type lower multilayer reflector 31, thereby forming a quantum well active layer. The quantum well layer 33 is formed by alternately stacking well layers of undoped GaAs and barrier layers of $Al_{0.30}Ga_{0.70}As$. The number of well layers is three (i.e., three pairs). The thickness of the entire quantum well active layer is $\lambda/n$.

A current confinement layer 35 composed of a p-type $Al_{0.98}Ga_{0.02}As$ layer 35a and an AlGaAs oxide layer 35b is formed on the quantum well active layer. A p-type upper multilayer reflector 36 is formed on the current confinement layer 35.

The p-type upper multilayer reflector 36 is a multilayer film formed by alternately stacking 12 pairs of $Al_{0.12}Ga_{0.88}As$ layers and p-type $Al_{0.90}Ga_{0.10}As$ layers each having a thickness of $\lambda/4n$. The layers are doped with carbon as a p-type impurity.

A p-type contact layer 37 of p-type GaAs is formed on the p-type upper multilayer reflector 36. To reduce contact resistance with an upper electrode, the p-type contact layer 37 is doped with carbon as a p-type impurity in a concentration of $1\times10^{19}$ cm$^{-3}$ or more.

The p-type contact layer 37, the p-type upper multilayer reflector 36, the current confinement layer 35, the quantum well active layer and a portion of the n-type lower multilayer reflector 31 are isolated from other regions by a recess formed by selectively removing the p-type contact layer 37, the p-type upper multilayer reflector 36, the current confinement layer 35, the quantum well active layer and the portion of the n-type lower multilayer reflector 31 until the n-type lower multilayer reflector 31 is partially exposed, thereby forming a mesa portion with a diameter of 20 μm.

A first protective layer 38 of $SiO_2$ is formed on the bottom and inner wall of the recess surrounding the mesa portion. A benzocyclobutene (BCB) resin film 39 is formed to fill the recess on which the first protective layer 38 is formed. The upper surface of the BCB resin film 39 and the upper surface of the mesa portion are flush with each other. A second protective layer 40 of $SiO_2$ is formed to cover the BCB resin film 39 and a portion of the upper surface of the mesa portion.

In the mesa portion, a metal opening array 13 serving as a metal reflector is formed on the p-type contact layer 37. The metal opening array 13 includes: an intermediate layer 41 of $SiO_2$ with a thickness of 113 nm; a metal layer 42 of silver (Ag) with a thickness of 200 nm; and a cap layer 43 of SiN with a thickness of 200 nm. In this embodiment, the metal opening array 13 has a diameter of 5 μm.

In the metal layer 42, openings 45 each in the shape of an ellipse having a major axis length of 250 nm and a minor axis length of 150 nm are formed at a pitch of 525 nm to form a square lattice. The openings 45 are oriented in one direction. The shape of each of the openings 45 only needs to have its width shorter than the length, i.e., have an anisotropy, and also shorter than the wavelength of emitted light. For example, the shape of each of the openings 45 may be an oval, a rectangle or a rhombus. In such cases, it is sufficient that the minor axis is shorter than the wavelength of emitted light. The shape may also be a shape such as a triangle or a quadrilateral symmetrical with respect to one axis or having no axis of symmetry. In such cases, it is sufficient that the width orthogonal to the longitudinal direction is shorter than the wavelength of emitted light.

An upper electrode 12 is formed on the p-type contact layer 37 except for a region where the metal opening array 13 is formed. A lower electrode 44 is formed on the back surface of the substrate 10.

Hereinafter, operation of the surface emitting laser of this embodiment will be described with reference to FIG. 4 again. Upon application of a bias voltage between the upper electrode 12 and the lower electrode 44, current flows from the upper electrode 12 through the p-type contact layer 37 and the p-type upper multilayer reflector 36. Current is confined in the p-type $Al_{0.98}Ga_{0.02}As$ layer 35a in the current confinement layer 35 and then is injected into the quantum well layer 33 so that recombination of carriers occurs in the quantum well layer 33. As a result, light emission occurs in the quantum well layer 33 and oscillation is generated in a resonator formed by the n-type lower multilayer reflector 31, the p-type upper multilayer reflector 36 and the metal opening array 13, thereby generating laser oscillation with a wavelength of 850 nm.

In this embodiment, the metal layer 42 in which the openings 45 are arranged to form a square lattice at a pitch of 525 nm is formed in the metal opening array 13. The lattice pitch P of the openings 45 satisfies a surface plasmon resonance condition represented by Expression (1):

$$0.9\times P \leq \lambda\times(i^2+j^2)^{1/2}/(\in_1\in_2/(\in_1+\in_2))^{1/2} \leq 1.1\times P \quad (1)$$

where $\lambda$ is the wavelength of laser light, i and j are integers which are not negative (e.g., 0, 1, 2, ...), $\in_1$ is the dielectric constant of the metal layer 42 and $\in_2$ is the dielectric constant of a medium in contact with the upper or lower surface of the metal layer 42.

In this embodiment, the emission wavelength $\lambda$ of laser light is 850 nm, the dielectric constant $\in_1$ of the Ag metal layer 42 is −32, the dielectric constant $\in_2$ is 2.25 because the lower surface of the metal layer 42 is in contact with $SiO_2$. Accordingly, suppose $(i^2+j^2)=1$, the lattice pitch P of the openings 45 satisfying the surface plasmon resonance condition is in the range from 495 nm to 605 nm, according to Expression (1). Therefore, the lattice pitch of the openings 45 of this embodiment satisfies the surface plasmon resonance condition.

The arrangement of the openings 45 in the metal layer 42 to satisfy the surface plasmon resonance condition in this manner allows 850-nm light oscillation in the resonator to be effectively converted into a surface plasmon at the surface of the metal layer 42. The surface plasmon is converted into light again at the side of the metal layer 42 toward the cap layer 43 and is emitted to outside the resonator.

Figure 5:
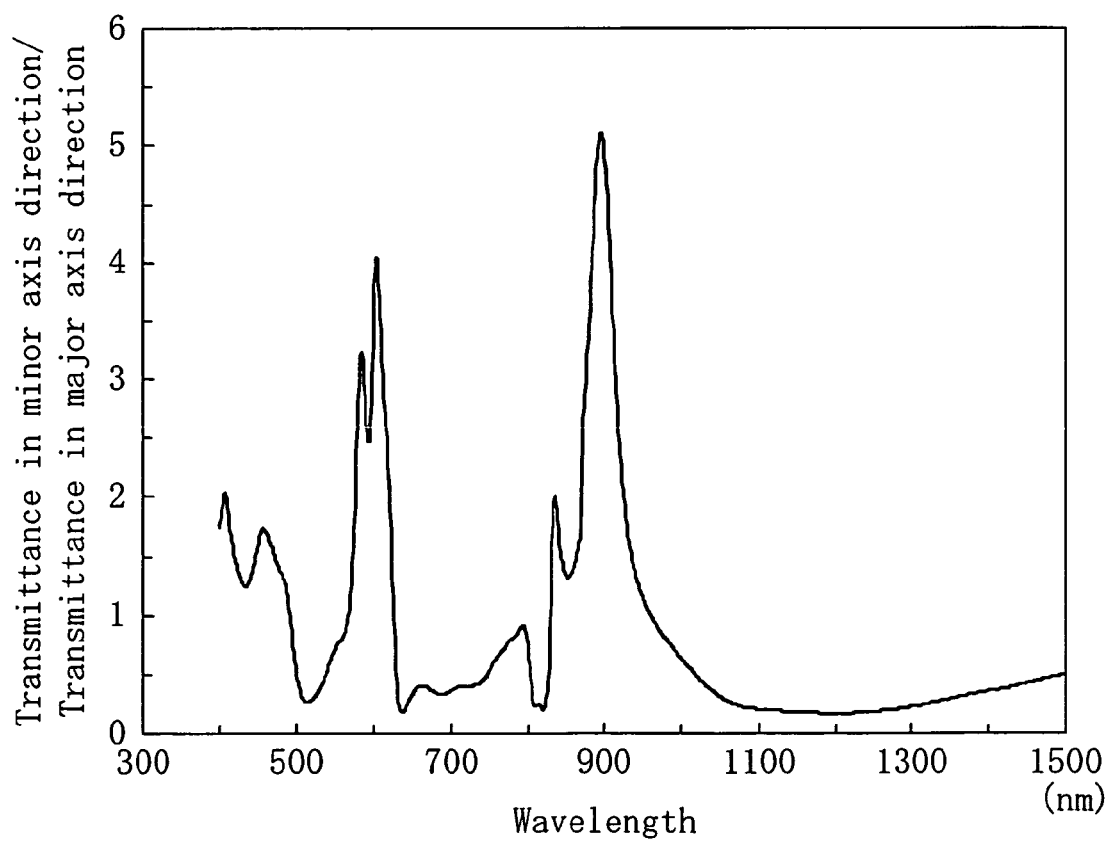
FIG. 5 is a graph showing a measurement result of light transmittance of a metal opening array used in the surface emitting laser of the first embodiment.

In addition, in this embodiment, the shape of the openings 45 is an ellipse, so that the transmittance of laser light passing through the metal opening array 13 depends on the linearly polarized light direction of laser light. FIG. 5 shows, as an intensity ratio, a result of measurement of the intensities of transmitted light beams, by irradiating a sample in which the metal opening array 13 is formed on a glass substrate with a linearly polarized light beam parallel to the minor axis of the ellipse and a linearly polarized light beam parallel to the major axis of the ellipse. In the graph, the lattice pitch P of the openings 45 is 550 nm.

As shown in FIG. 5, the shape of the openings 45 has an isotropy, thus obtaining different transmittances between the polarization directions. FIG. 5 also shows that the direction of a main polarized wave depends on the wavelength of incident light. As shown in FIG. 5, the transmittance of light in the minor axis direction with respect to the transmittance of light in the major axis direction is at the maximum when the wavelength is 890 nm. This shows that when non-polarized light with a wavelength of 890 nm enters the metal opening array 13, linearly polarized light in the direction of the minor axis of the ellipse is effectively converted into emitted light in which linearly polarized light in the minor axis direction of the ellipse is dominant.

The light wavelength at which surface plasmon resonance of light occurs at the surface of the metal opening array 13 is proportional to the lattice pitch. Accordingly, if the lattice pitch P is set at 525 nm, which is 0.95 times as large as 550 nm, as in this embodiment, the linearly polarized light in the minor axis direction becomes dominant at 850 nm, which is the laser oscillation wavelength, so that emitted light subjected to polarization control in the minor axis direction is obtained. If the pitch of the openings 45 is adjusted, emitted light subjected to polarization control in the major axis direction can be obtained.

As described above, the openings 45 are oriented in different directions among the metal opening arrays 13 of the light-emitting portion 11A, the light-emitting portion 11B, the light-emitting portion 11C and the light-emitting portion 11D, respectively, so that it is possible to emit linearly polarized light beams in different directions from the respective light-emitting portions.

Figure 6:
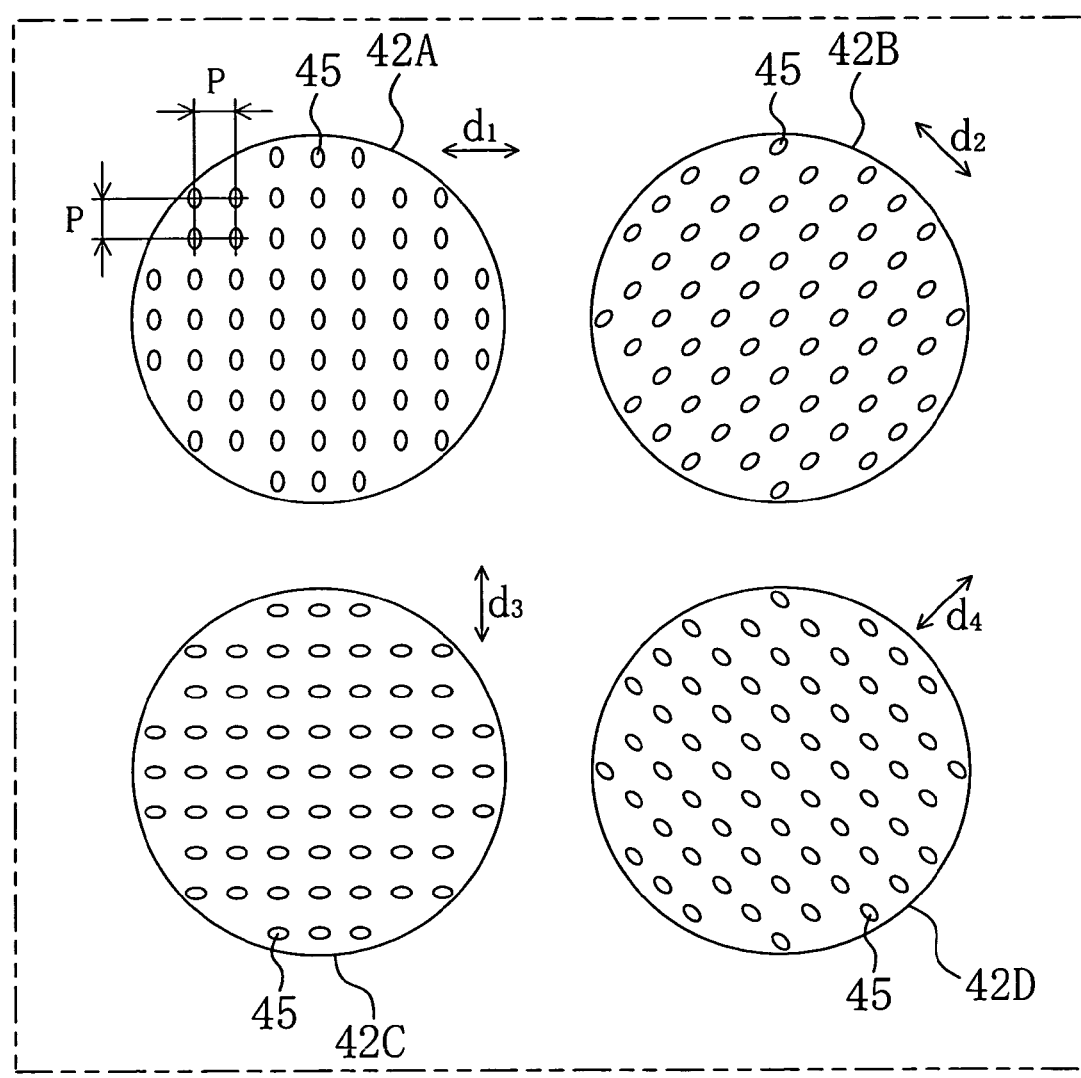
FIG. 6 is a plan view illustrating metal layers of the surface emitting laser of the first embodiment.

FIG. 6 illustrates only the metal layers of the surface emitting laser of this embodiment in an enlarged manner. As illustrated in FIG. 6, the directions $d_2$, $d_3$ and $d_4$ of arrangements of the openings 45 in the metal layers of the light-emitting portion 11B, the light-emitting portion 11C and the light-emitting portion 11D are rotated 45°, 90° and 135°, respectively, in a clockwise direction with respect to the direction $d_1$ of the openings 45 in the metal layer 42A of the light-emitting portion 11A. Accordingly, linearly polarized light beams in directions rotated 45°, 90° and 135° with respect to a light beam emitted from the light-emitting portion 11A are obtained by the light-emitting portion 11B, the light-emitting portion 11C and the light-emitting portion 11D, respectively.

As described above, the light-emitting portion 11A, the light-emitting portion 11B, the light-emitting portion 11C and the light-emitting portion 11D are driven independently of each other using the upper electrode 12A, the upper electrode 12B, the upper electrode 12C and the upper electrode 12D, so that laser light beams in different linearly polarized light directions are emitted at a time from the respective light-emitting portions. In addition, since the light-emitting portions are closely located, emitted light beams are coupled to one optical fiber without using, for example, a prism and are emitted as a polarization multiplexed optical signal.

With the surface emitting laser of this embodiment, a plurality of laser light beams in different linearly polarized light directions are obtained only by making the directions of arrangements of the openings in the metal layers of the respective light-emitting portions differ from one another. The direction of arrangement of the openings provided in a metal layer is precisely controlled by using known photolithography, for example. Accordingly, control in linearly polarized light directions is easy and adjustment is unnecessary. In addition, a plurality of light-emitting portions for emitting laser light beams in different linearly polarized light directions is allowed to be formed within a small region so that the laser light beams are coupled directly to the optical fiber. In this manner, the size of the device is reduced and, in addition, occurrence of a problem in which linearly polarized light beams shift before coupling to the optical fiber is avoided. In the case of directly coupling laser light directions to the optical fiber, the light-emitting portions are preferably formed within a region with the diameter of the core of the optical fiber.

First Modified Example of Embodiment 1

Figure 7:
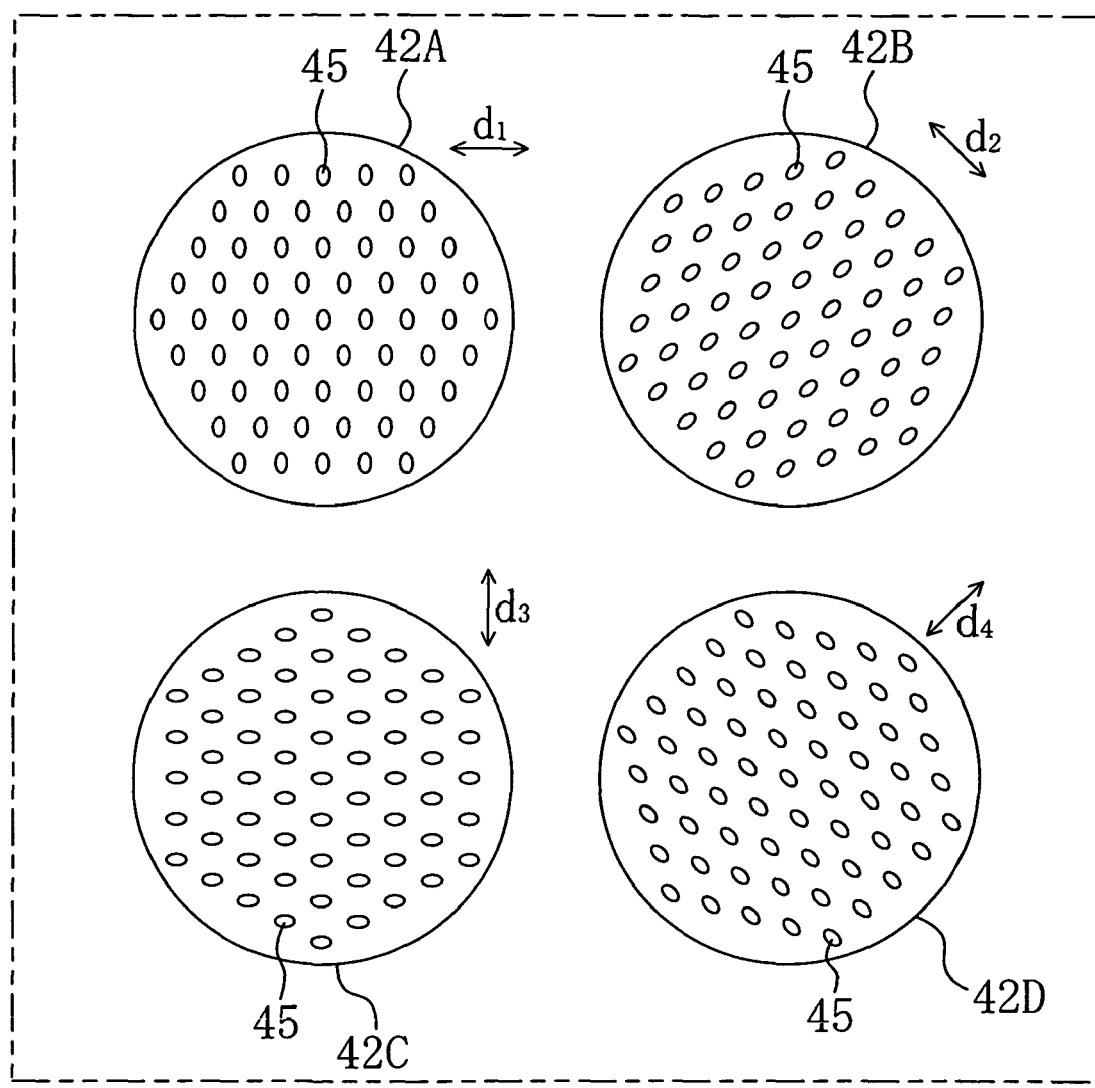
FIG. 7 is a plan view illustrating metal layers of a surface emitting laser according to a first modified example of the first embodiment.

FIG. 7 illustrates metal layers in a surface emitting laser according to a first modified example of the first embodiment in an enlarged manner. As illustrated in FIG. 7, in the surface emitting laser of this modified example, openings 45 provided in each metal layer are arranged to form a hexagonal lattice.

In this modified example, the directions $d_2$, $d_3$ and $d_4$ of arrangements of the openings 45 in the light-emitting portion 11B, light-emitting portion 11C and the light-emitting portion 11D are also rotated 45°, 90° and 135°, respectively, in a clockwise direction with respect to the direction $d_1$ of arrangement of the openings 45 in the metal layer 42A of the light-emitting portion 11A. Accordingly, linearly polarized light beams in directions rotated 45°, 90° and 135° with respect to a light beam emitted from the light-emitting portion 11A are obtained by the light-emitting portion 11B, the light-emitting portion 11C and the light-emitting portion 11D, respectively.

In addition, in this modified example, the direction of the minor axes of the openings 45, which are ellipses in plan view, coincides with the direction of the hexagonal lattice formed by the openings 45, and the pitch in the arrangement satisfies the surface plasmon resonance condition represented by Expression (1). On the other hand, the direction of the major axes of the ellipses does not coincide with the direction of the lattice, so that polarized waves are strongly controlled in the minor axis direction of the openings 45 in laser light beams emitted from the light-emitting portions. Accordingly, light emission having a particularly high polarized-light ratio is obtained.

Second Modified Example of Embodiment 1

Figure 8:
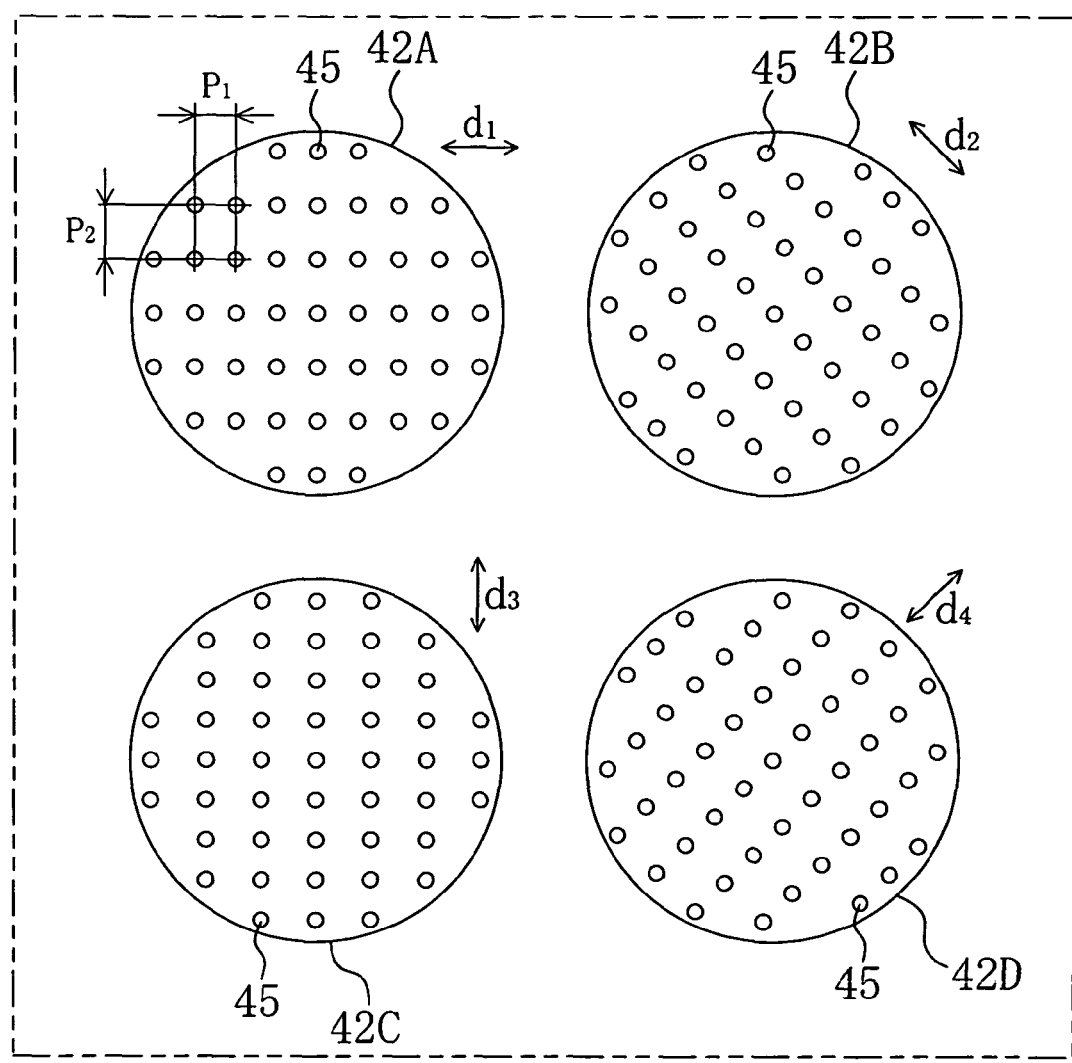
FIG. 8 is a plan view illustrating metal layers of a surface emitting laser according to a second modified example of the first embodiment.

FIG. 8 illustrates metal layers in a surface emitting laser according to a second modified example of the first embodiment in an enlarged manner. As illustrated in FIG. 8, in the surface emitting laser of this modified example, each opening 45 provided in each metal layer is circular and the diameter of the opening 45 is shorter than the wavelength of emitted light. In addition, the openings 45 are arranged to form a rectangular lattice. Out of the lattice pitches $P_1$ and $P_2$ of the openings 45, the lattice pitch $P_1$ satisfies the surface plasmon resonance condition represented by Expression (1), whereas the lattice pitch $P_2$ does not satisfy the surface plasmon resonance condition.

For example, in this modified example, the diameter of the openings 45 is 200 nm, the lattice pitch $P_1$ is 550 nm and the lattice pitch $P_2$ is 750 nm. In this manner, with respect to laser light with a wavelength of 850 nm, the surface plasmon resonance condition represented by Expression (1) is satisfied in the direction of $P_1$ but is not satisfied in the direction of $P_2$. Accordingly, laser light having linearly polarized light in the $P_1$ direction is emitted.

The direction of the lattice formed by the openings 45 differs among the light-emitting portions. In this modified example, the directions $d_2$, $d_3$ and $d_4$ of the lattices in the light-emitting portion 11B, the light-emitting portion 11C and the light-emitting portion 11D are rotated 45°, 90° and 135°, respectively, in a clockwise direction with respect to the direction $d_1$ of the lattice in the light-emitting portion 11A. Accordingly, linearly polarized light beams in directions rotated 45°, 90° and 135° with respect to a light beam emitted from the light-emitting portion 11A are obtained by the light-emitting portion 11B, the light-emitting portion 11C and the light-emitting portion 11D, respectively.

Third Modified Example of Embodiment 1

Figure 9:
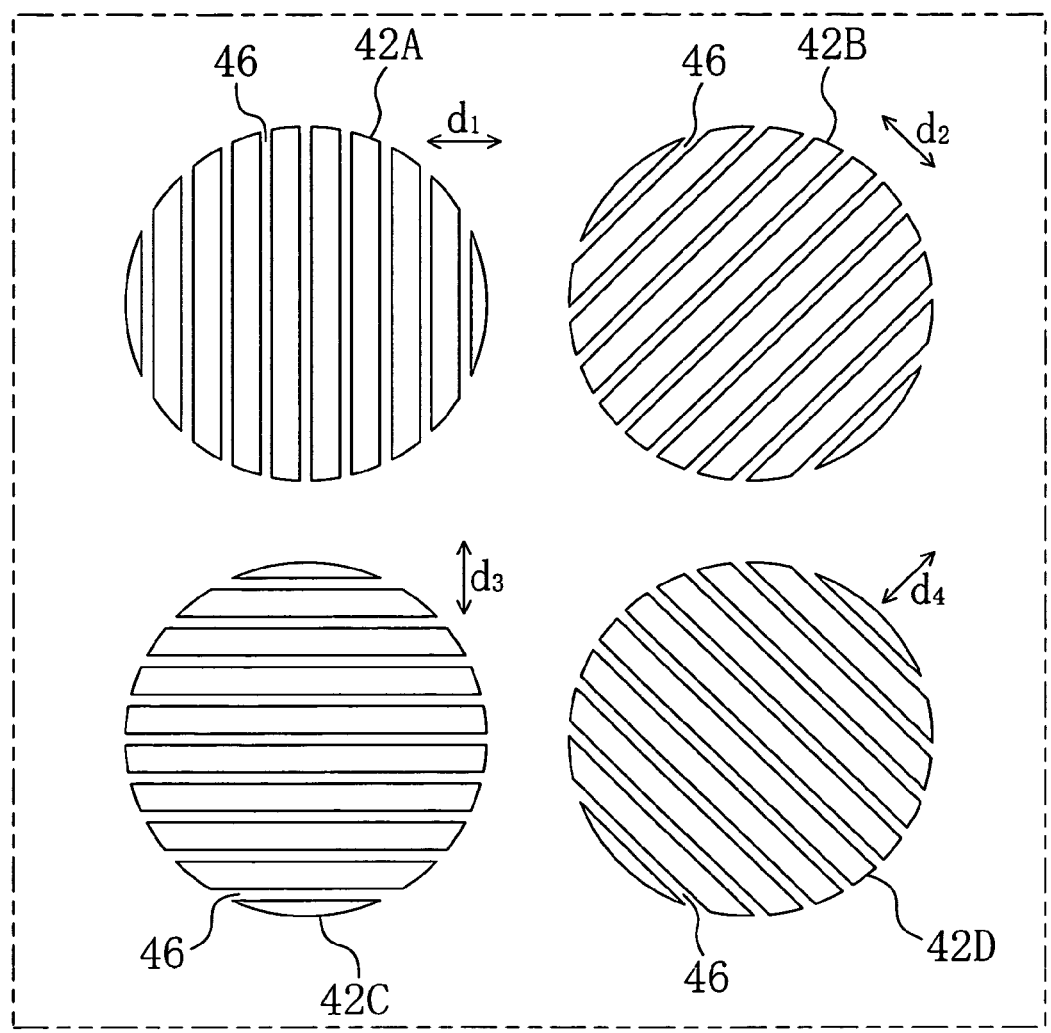
FIG. 9 is a plan view illustrating metal layers of a surface emitting laser according to a third modified example of the first embodiment.

FIG. 9 illustrates metal layers in a surface emitting laser according to a third modified example of the first embodiment in an enlarged manner. As illustrated in FIG. 9, in the surface emitting laser of this modified example, openings 46 each in the shape of a stripe are arranged at regular intervals in each metal layer.

In this modified example, the width of each stripe is 200 µm, and the pitch of the stripes is 550 nm. Accordingly, in laser light with a wavelength of 550 nm, linearly polarized light in a direction vertical to the direction along which the stripes extend satisfies the surface plasmon resonance condition and, thus, passes through a metal opening array 13.

In this modified example, the directions $d_2$, $d_3$ and $d_4$ of arrangements of the openings 46 in the light-emitting portion 11B, the light-emitting portion 11C and the light-emitting portion 11D are rotated 45°, 90° and 135°, respectively, in a clockwise direction with respect to the direction $d_1$ of arrangement of the openings 46 in the metal layer 42A of the light-emitting portion 11A. Accordingly, linearly polarized light beams in directions rotated 45°, 90° and 135° with respect to a light beam emitted from the light-emitting portion 11A are obtained by the light-emitting portion 11B, the light-emitting portion 11C and the light-emitting portion 11D, respectively.

Fourth Modified Example of Embodiment 1

Figure 10A:
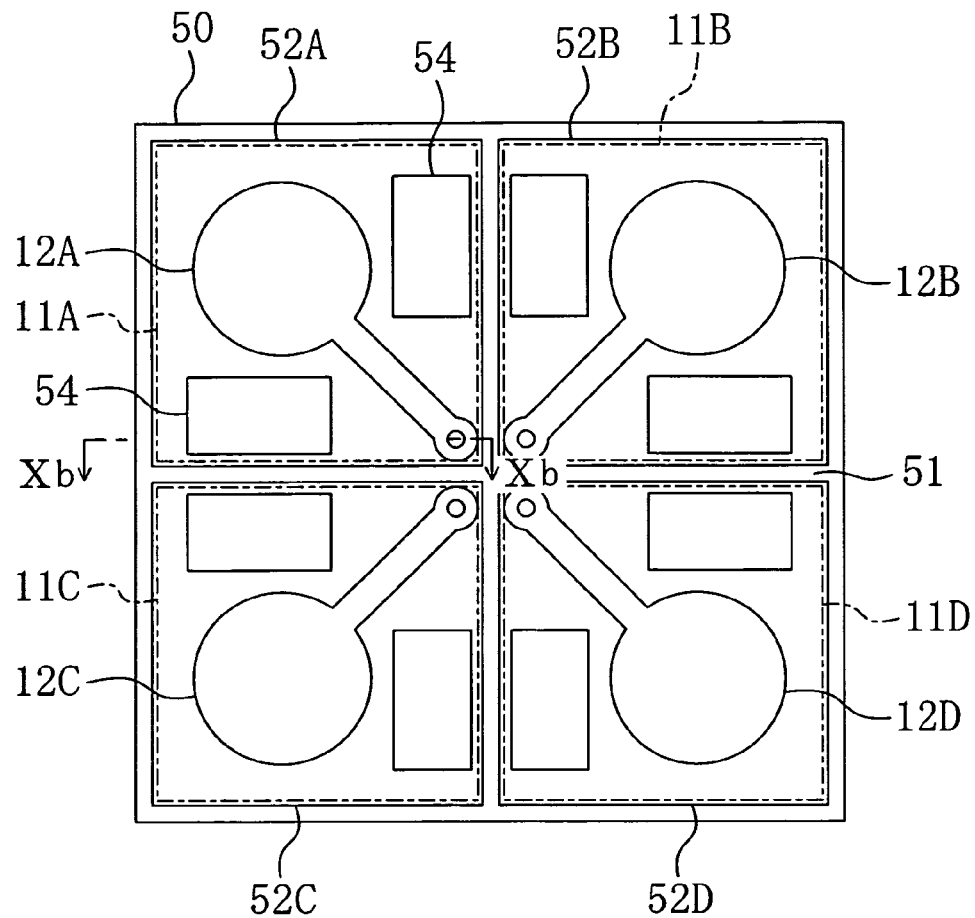
FIGS. 10A and 10B illustrate a surface emitting laser according to a fourth modified example of the first embodiment.
Figure 10B:
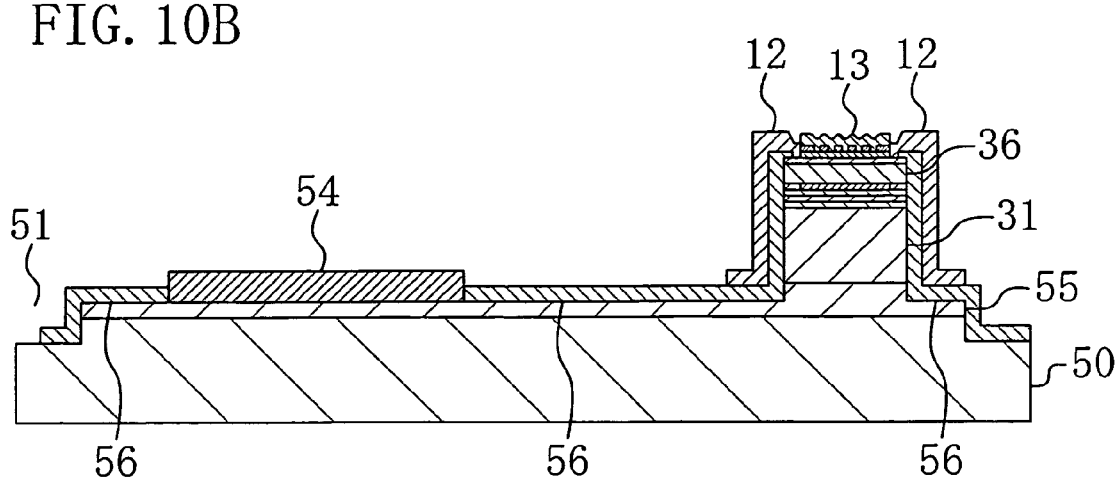

FIGS. 10A and 10B illustrate a surface emitting laser according to a fourth modified example of the first embodiment. FIG. 10A is a plan view and FIG. 10B is a cross-sectional view taken along the line Xb-Xb in FIG. 10A. In FIGS. 10A and 10B, components also shown in FIG. 4 are denoted by the same reference numerals, and description thereof will be omitted.

As illustrated in FIGS. 10A and 10B, the surface emitting laser of this modified example includes four light-emitting portions: a light-emitting portion 11A, a light-emitting portion 11B, a light-emitting portion 11C and a light-emitting portion 11D, formed on a semi-insulating substrate 50. The light-emitting portions 11A through 11D are formed on a region 52A, a region 52B, a region 52C and a region 52D, respectively, which are formed on the substrate 50 and electrically isolated from each other.

As illustrated in FIG. 10B, an n-type GaAs layer 55 is formed on the substrate 50 in each of the regions. A mesa resonator and an n-side electrode 54 are formed on the GaAs layer 55 and spaced from each other. An insulating protective layer 56 is formed to cover the upper surface of the GaAs layer 55. This structure makes the n-side electrodes 54 isolated from one another among the light-emitting portions. Accordingly, an electrical crosstalk between the light-emitting portions is prevented, thus obtaining a surface emitting laser in which the polarization plane is stabilized in each light-emitting portion.

In this modified example, a structure in which the mesa portion has a height difference is described. However, as in the other modified examples, a recess surrounding the mesa portion may be filled with a BCB resin film.

In the first embodiment and the modified examples thereof, four light-emitting portions are provided. However, the number of light-emitting portions is not limited to this. If the number of light-emitting portions is large, transmission capacity is allowed to be increased. On the other hand, if the number of light-emitting portions is small, a crosstalk between polarized waves is reduced, so that communication quality is improved.

The material of the metal layer 42 is not necessarily silver (Ag) and may be other materials such as gold (Au) or aluminum (Al). The material forming the semiconductor layer is not necessarily aluminum gallium arsenide (AlGaAs) and may be other materials such as an indium phosphorus (InP)-based material or a gallium nitride (GaN)-based material. In the foregoing description, 12 pairs of layers form the p-type upper multilayer reflector 36. However, since the reflectance of the metal opening array 13 varies depending on structural parameters such as the diameter of the openings 45, the number of pairs of layers forming the p-type upper multilayer reflector 36 may be appropriately set accordingly. Specifically, it is preferable that the number of pairs of layers forming the multilayer is set in the range from 9 to 22, both inclusive, and the reflectance of the total reflector at the emission end is set at about 99%. In this structure, the n-type layers are formed at the side toward the substrate. However, the present invention is not limited to this, and p-type layers may be formed at the side toward the substrate.

In the first embodiment and the modified examples thereof, the reflectances of the p-type upper multilayer reflector 36 and the metal opening array 13 serving as a metal reflector are set at high values, laser oscillation is caused to occur in laser light beams emitted in all the linearly polarized light directions, and a laser light beam in a specific one of the linearly polarized light direction is allowed to pass through, so that the linearly polarized light directions are controlled. On the other hand, the linearly polarized light directions may be controlled in the following manner. That is, the number of pairs of layers forming the p-type upper multilayer reflector is set small, for example, so that the reflectance of the entire reflectors at the emission end is reduced. Accordingly, laser oscillation is less likely to occur in the linearly polarized light direction having high light transmittance, laser oscillation is caused to occur only in an emitted light beam in a specific linearly polarized light direction, and this emitted light beam is taken out.

Fifth Modified Example of Embodiment 1

Hereinafter, a fifth modified example of the first embodiment will be described with reference to the drawings. A surface emitting laser according to this modified example includes metal layers 42 in which the shape of each opening 45 shown in FIG. 8 is circular. As in the first embodiment and the other modified examples, the emission wavelength of the surface emitting laser of this modified example is 850 nm, and a metal opening array 13 is composed of a cap layer 43 of SiN, a metal layer 42 of Ag and an intermediate layer 41 of $SiO_2$.

In this modified example, the lattice pitch $P_1$ of the openings 45 is 375 nm and the lattice pitch $P_2$ of the openings 45 is 525 nm. Suppose the dielectric constant $\in_2$ in Expression (1) is the dielectric constant of 4, which is the dielectric constant of SiN in contact with the upper surface of the metal layer and $(i^2+j^2)=1$, the lattice pitch $P_1$ satisfies the surface plasmon resonance condition but the lattice pitch $P_2$ does not satisfy the surface plasmon resonance condition.

Figure 11:
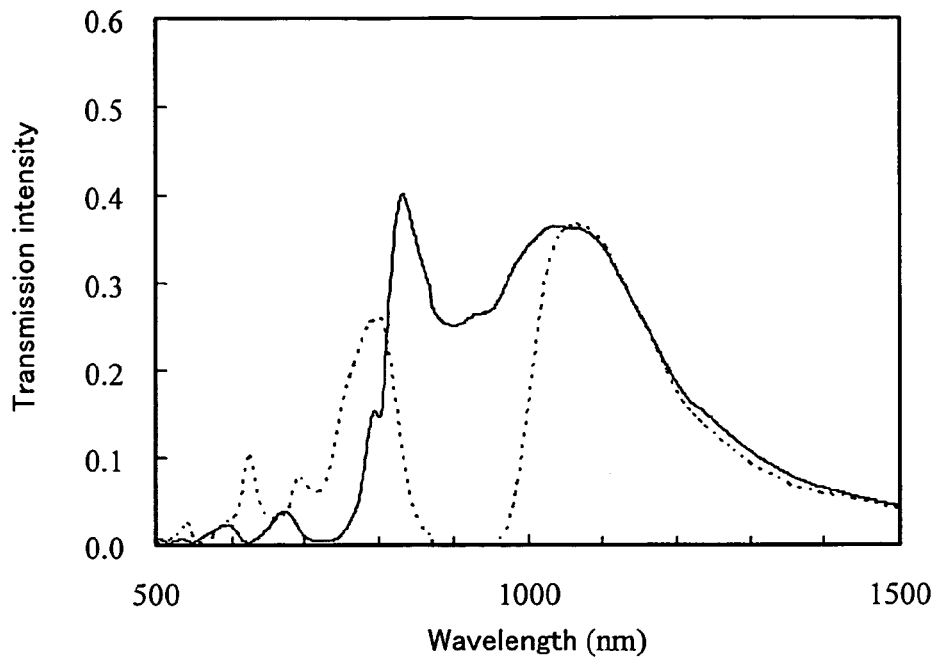
FIG. 11 is a graph showing light transmittance of a metal opening array used in a surface emitting laser according to a fifth modified example of the first embodiment.

FIG. 11 shows a light transmittance characteristic of the metal opening array 13 formed on a transparent substrate in this modified example. As shown in FIG. 11, in a case where the linearly polarized light direction of a light beam indicated by the solid line coincides with the direction of $P_1$ of the metal layer 42, the light beam passes through the metal opening array 13 around a region where the wavelength is 800 nm to 1000 nm and a strong peak is observed at 830 nm. However, in a case where the polarization direction of a light beam indicated by the broken line coincides with the direction of $P_2$, the light intensity attenuates around the region where the wavelength is 800 nm to 1000 nm and especially a light beam with a wavelength of around 900 nm hardly passes through the metal opening array 13.

Figure 12:
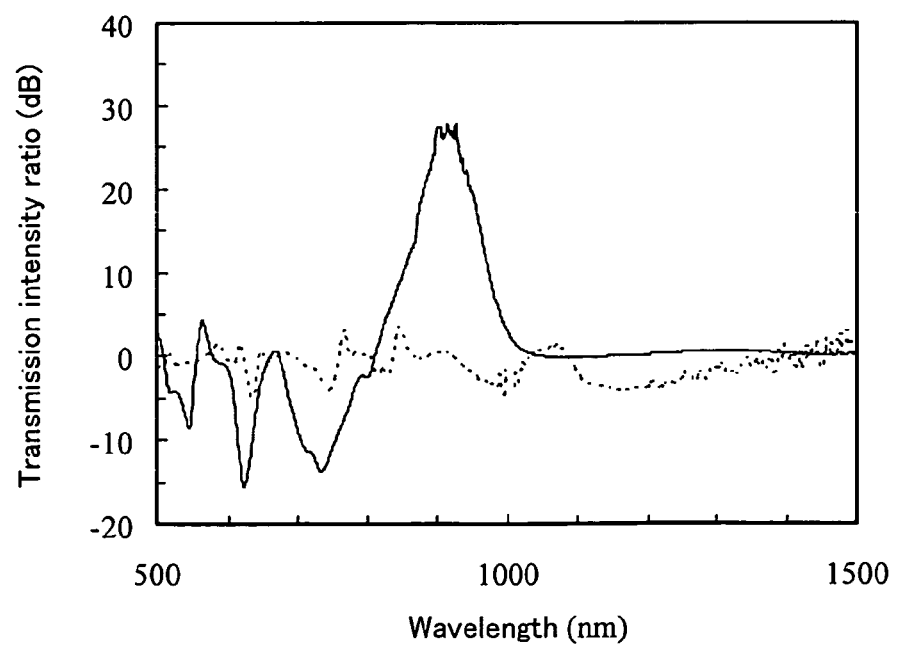
FIG. 12 is a graph showing light transmittance of a metal opening array used in the surface emitting laser according to the fifth modified example of the first embodiment.

FIG. 12 shows the ratio between the light beam in the polarization direction which coincides with the direction of $P_1$ and the light beam in the polarization direction which coincides with the direction of $P_2$. In FIG. 12, in the case of a metal opening array 13 indicated by the solid line in which the lattice pitches $P_1$ and $P_2$ are 375 nm and 525 nm, respectively, the intensity ratio is at the maximum around 900 nm and high selectivity of the polarization direction is also exhibited at 850 nm. On the other hand, in the case of a metal opening array 13 indicated by the broken line in which the lattice pitches $P_1$ and $P_2$ are both 550 nm and the surface plasmon resonance condition is not satisfied, dependence of transmission light intensity on polarization direction is not observed at any wavelength.

As described above, not only in the case where the surface plasmon resonance condition is satisfied with respect to the dielectric film in contact with the lower surface of the metal film but also in the case where the surface plasmon resonance condition is satisfied with respect to the dielectric film in contact with the upper surface of the metal film, a metal opening array capable of controlling the polarization direction is obtained.

Figure 13A:
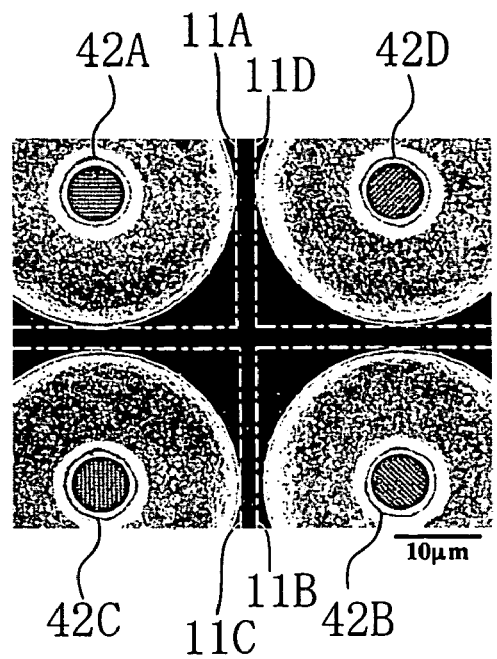
FIGS. 13A and 13B are scanning electron microscope photographs showing the surface emitting laser according to the fifth modified example of the first embodiment.
Figure 13B:
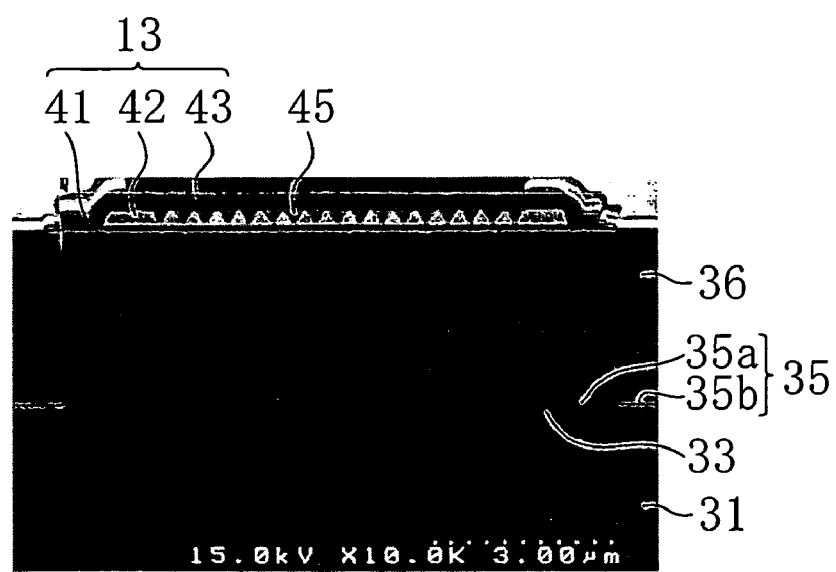

FIGS. 13A and 13B show results of observation of the surface emitting laser according to this modified example with an electron microscope. FIG. 13A is a plan view corresponding to FIG. 2 and FIG. 13B is a cross-sectional view corresponding to FIG. 4. In this modified example, as shown in FIG. 13A, the position of the light-emitting portion 11B including an opening array 42B in which the lattice direction is $d_2$ is replaced with the position of the light-emitting portion 11D including an opening array 42D in which the lattice direction is $d_4$.

Figure 14A:
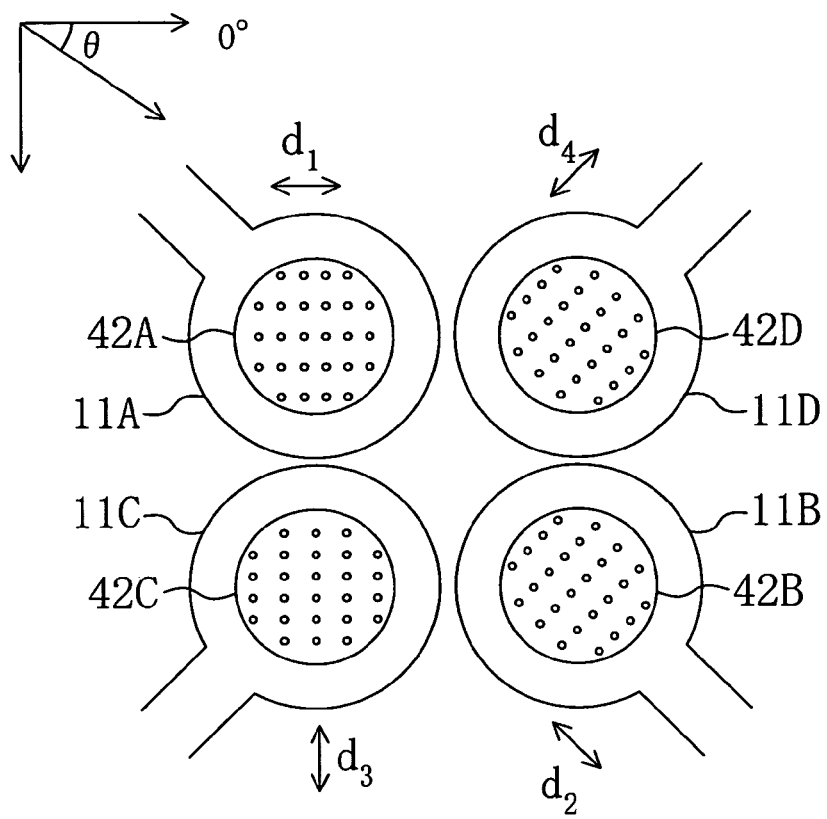
FIGS. 14A and 14B show polarized light characteristics of light-emitting portions of the surface emitting laser according to the fifth modified example of the first embodiment.

Polarization characteristic of the light-emitting portions in the surface emitting laser with the foregoing structure will be described with reference to FIGS. 14A and 14B. Outputs from the respective light-emitting portions are caused to enter the polarizing plate so that a correlation between the angle θ of the polarizing plate and light which has passed through the polarizing plate when the polarizing plate is rotated is measured to evaluate polarization characteristics of the light-emitting portions. In this case, the angle θ of the polarizing plate is the angle of the polarizing plate rotated in a clockwise direction relative to the direction (0°) which coincides with the lattice direction $d_1$ of the metal opening array 42A in the light-emitting portion 11A, as shown in FIG. 14A.

Figure 14B:
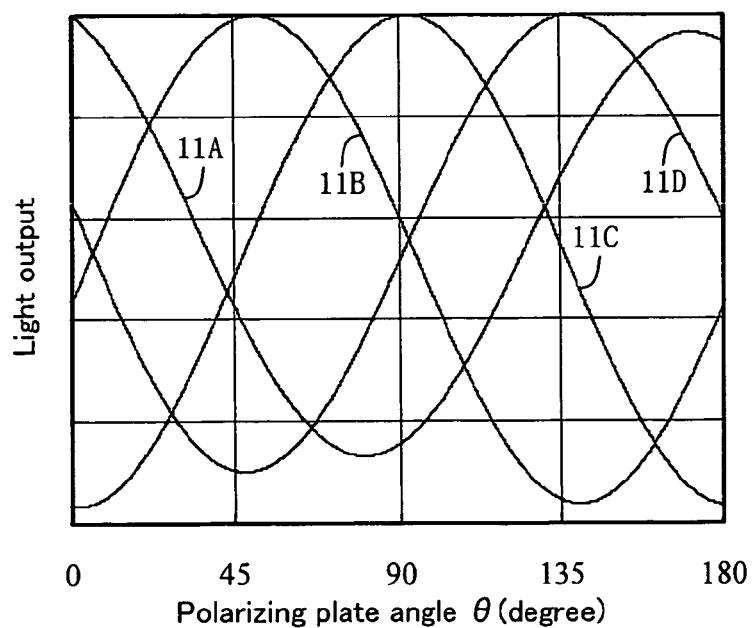

FIG. 14B shows a correlation between the angle θ of the polarizing plate and the output of each of the light-emitting portions. The ordinate represents the intensity of light which has passed through the polarizing plate, whereas the abscissa represents the angle θ of the polarizing plate. As shown in FIG. 14B, intensities of a light beam emitted from the light-emitting portion 11A including the metal opening array 42A in which the lattice direction is $d_1$, a light beam emitted from the light-emitting portion 11B including the metal opening array 42B in which the lattice direction is $d_2$, a light beam emitted from the light-emitting portion 11C including the metal opening array 42C in which the lattice direction is $d_3$ and a light beam emitted from the light-emitting portion 11D including the metal opening array 42D in which the lattice direction is $d_4$ are at the maximum at respective points at each of which the polarizing plate shifts by 45 degrees. Accordingly, it is clear that four laser light beams in different polarization directions are generated at a time from the surface emitting laser of this modified example.

In this modified example, the materials of the intermediate layer, the metal film and the cap layer may also be changed as in the first embodiment and the other modified examples.

Embodiment 2

Figure 15:
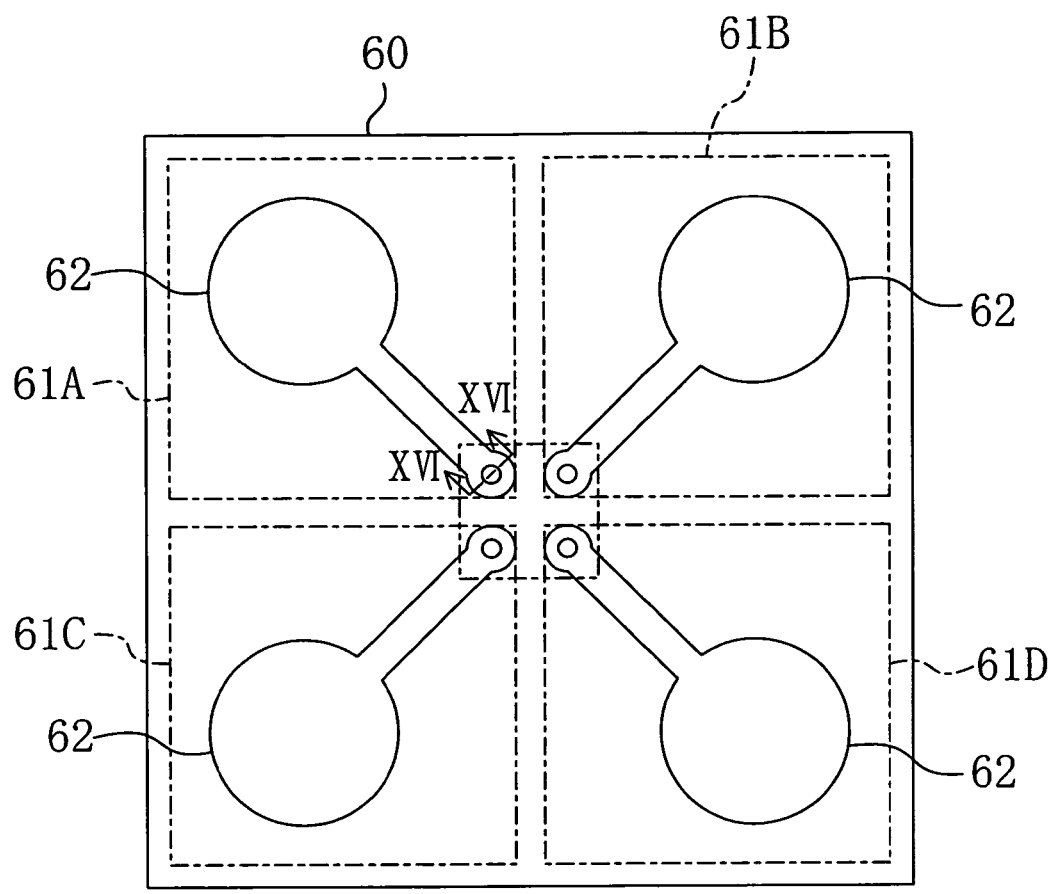
FIG. 15 is a plan view illustrating a photodetector according to a second embodiment of the present invention.
Figure 16:
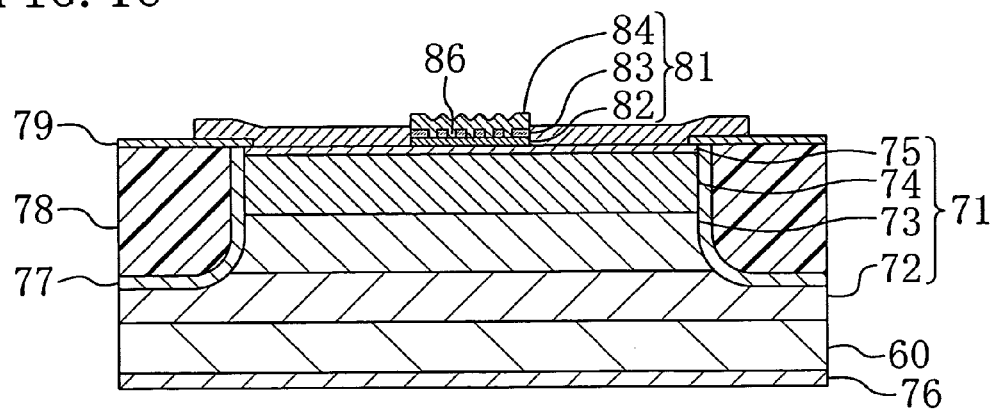
FIG. 16 is a cross-sectional view illustrating the photodetector of the second embodiment taken along the line XVI-XVI in FIG. 15.

Hereinafter, a second embodiment of the present invention will be described with reference to the drawings. FIG. 15 is a plan view illustrating a configuration of a photodetector according to the second embodiment. FIG. 16 illustrates a cross-sectional structure taken along the line XVI-XVI in FIG. 15.

As shown in FIG. 15, the photodetector of this embodiment includes four light-receiving portions: a light-receiving portion 61A; a light-receiving portion 61B; a light-receiving portion 61C; and a light-receiving portion 61D. The light-receiving portions 61A through 61D are formed on a substrate 60. A first electrode 62 is formed in each of the light-receiving portions independently of first electrodes 62 of the other light-receiving portions, thus allowing the light-receiving portions to be driven independently of each other.

As shown in FIG. 16, each of the light-receiving portions according to the second embodiment includes: a photo diode 71 formed on the substrate 60 made of n-type gallium arsenide (GaAs); and a metal opening array 81.

The photo diode 71 is a photo diode with a PIN structure including: a semiconductor layer 72 made of n-type GaAs; a light absorbing layer 73 made of undoped GaAs; a window layer 74 made of p-type AlGaAs; and a contact layer 75 made of p-type GaAs. A first electrode 62 is formed on the contact layer 75. A second electrode 76 is formed on the back surface of the substrate 60.

The contact layer 75, the window layer 74, the light absorbing layer 73 and a portion of the semiconductor layer 72 are isolated from other regions by a recess formed by selectively removing the contact layer 75, the window layer 74, the light absorbing layer 73 and the portion of the semiconductor layer 72 until the semiconductor layer 72 is partially exposed, thereby forming a mesa portion with a diameter of 20 µm.

A first protective layer 77 made of $SiO_2$ is formed on the bottom and inner wall of the recess surrounding the mesa portion. A BCB resin film 78 is formed to fill the recess on which the first protective layer 77 is formed. The upper surface of the BCB resin film 78 and the upper surface of the mesa portion are flush with each other. A second protective layer 79 of $SiO_2$ is formed to cover the BCB resin film 78 and a portion of the upper surface of the mesa portion.

A metal opening array 81 is formed on the p-type contact layer 75 in the mesa portion. The metal opening array 81 has the same structure as the metal opening array of the surface emitting laser of the first embodiment, and includes: an intermediate layer 82 made of $SiO_2$; a metal layer 83 made of silver (Ag) and including a plurality of openings 86 arranged at regular intervals; and a cap layer 84 made of SiN.

The metal opening array 81 allows only a light beam in a specific linearly polarized light direction determined by the direction of arrangement of the openings 86 in the metal layer 83 to pass therethrough. Each of the light-receiving portions detects only a light beam in a specific linearly polarized light direction out of incident light beams. As in the surface emitting laser of the first embodiment, the directions of arrangements of the openings 86 formed in the metal layers 83 of the light-receiving portion 61B, the light-receiving portion 61C and the light-receiving portion 61D are rotated 45°, 90° and 135°, respectively, in a clockwise direction with respect to the direction of arrangement of the openings 86 formed in the metal layer 83 of the light-receiving portion 61A in the photodetector of this embodiment. Accordingly, light beams in linearly polarized light directions rotated 45°, 90° and 135° with respect to a light beam detected by the light-receiving portion 61A are obtained by the light-receiving portion 61B, the light-receiving portion 61C and the light-receiving portion 61D, respectively.

The shape and arrangement of the openings 86 only need to be the same as in the first embodiment. For example, as in the first embodiment, it is sufficient that the shape of each of the openings 86 is an ellipse whose width is shorter than the length thereof and is shorter than the wavelength of light to be detected, i.e., an ellipse having anisotropy, and the openings 86 are oriented in one direction to form a square lattice. The openings 86 may have a configuration as shown in the modified examples of the first embodiment.

The lattice pitch of the openings 86 satisfies the surface plasmon resonance condition represented by Expression (1), so that surface plasmon excitation occurs in the metal opening array 81 and light transmittance in the metal opening array 81 is higher than that simply obtained from the aperture ratio of the metal layer 83. Accordingly, the area of the light-receiving portions is reduced and the device capacity is reduced, so that a photodetector capable of operating at high speed is obtained. In this case, the wavelength $\lambda$ is the wavelength of light to be detected.

The metal opening array in the photodetector of this embodiment allows only light having a wavelength matching with the size of the openings 86 formed in the metal layer 83 to pass therethrough. Accordingly, in application of the photodetector of this embodiment to a receiver of an optical communication system, a filter for blocking light beams with wavelengths other than signal light is unnecessary.

In the case of a receiver of an optical communication system using an optical fiber as a transmission path, the light-receiving portions are preferably placed within a region irradiated with light emitted from the optical fiber. For example, for a general optical fiber having a core diameter of 100 μm, the light-receiving portions are placed within a region having a diameter of 100 μm or less. Then, the optical fiber is allowed to be directly coupled to the photodetector.

The photodetector of this embodiment has a structure in which the recess surrounding the mesa portion is filled with the BCB film. Alternatively, as in the surface emitting laser of the fourth modified example of the first embodiment, the mesa portion may have a height difference. A trench may be formed in a semi-insulating substrate to form an electrically-isolated region so that the second electrodes are formed on the upper surface of the substrate to be independent of each other among the light-receiving portions.

In this embodiment, four light-receiving portions are provided. However, the number of light-receiving portions is not limited to this. In a case where the photodetector of this embodiment and a surface emitting laser including a plurality of light-emitting portions are combined to form an optical communication system, the number of light-receiving portions included in the photodetector is preferably equal to the number of light-emitting portions of the surface emitting laser.

Embodiment 3

Figure 17:
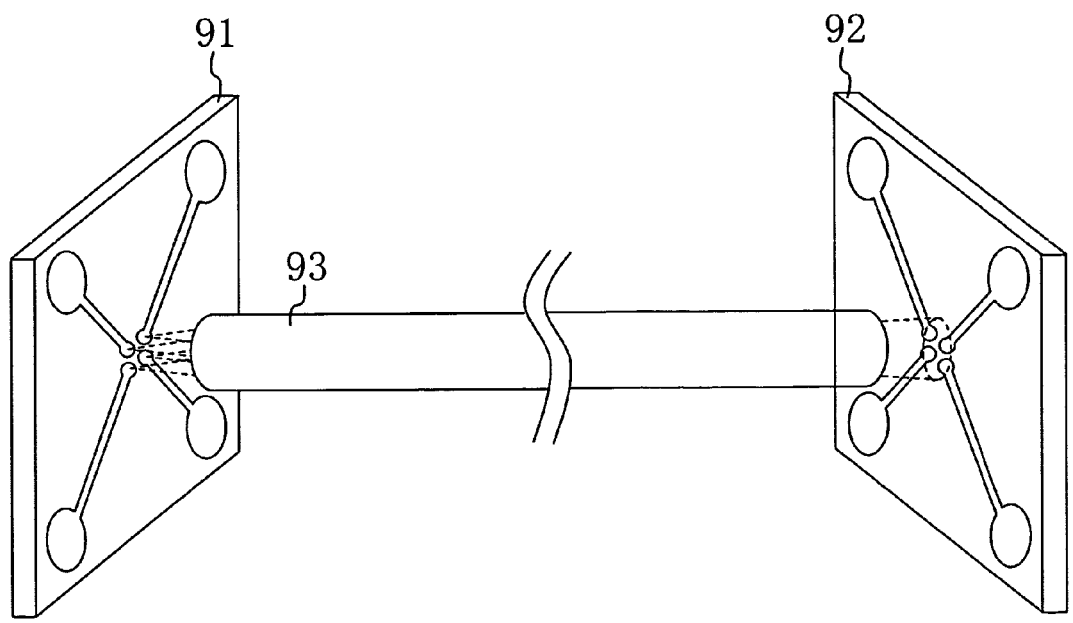
FIG. 17 is a view schematically illustrating an optical communication system according to a third embodiment of the present invention.

Hereinafter, a third embodiment of the present invention will be described with reference to the drawings. FIG. 17 illustrates an optical communication system according to the third embodiment. As illustrated in FIG. 17, the optical communication system of this embodiment includes: a transmitter 91 including the surface emitting laser of the first embodiment; a receiver 92 including the photodetector of the second embodiment; and a polarization-preserving optical fiber 93 serving as a signal transmission path for connecting the transmitter 91 and the receiver 92 together.

The transmitter 91 is formed by the surface emitting laser including four light-emitting portions for emitting laser light beams in different linearly polarized light directions, so that polarization multiplexed optical signal light in four channels is output. In addition, the light-emitting portions are closely located, so that it is possible to directly couple the transmitter 91 to the polarization-preserving optical fiber 93 without using a prism or other components.

A polarization multiplexed optical signal transmitted through the polarization-preserving optical fiber 93 is emitted from an end toward the receiver 92 with the linearly polarized light directions maintained. The emitted polarization multiplexed signal light enters the light-receiving portions provided in the photodetector forming the receiver 92. Each of the light-receiving portions of the photodetector includes a metal opening array having the same structure as an associated one of the light-emitting portions of the surface emitting laser. Accordingly, out of four laser light beams in different linearly polarized light directions included in the polarization multiplexed signal light, each of the light-receiving portions detects an associated laser light beam in a linearly polarized light direction. Since the light-receiving portions are close to each other, coupling between the receiver 92 and the optical fiber 93 does not need a prism or other components, either.

The optical communication system of this embodiment uses one surface emitting laser and one photodetector to perform optical communication using a polarization multiplexed signal in four channels. In addition, coupling between the optical fiber and each of the transmitter and the receiver does not need a prism or other components. Accordingly, an optical communication system is very easily implemented. If the number of light-emitting portions of the surface emitting laser or the number of light-receiving portions of the photodetector is changed, the number of channels is changed.

The optical communication system of this embodiment uses a polarization-preserving optical fiber for optical signal transmission between the transmitter and the receiver. However, within a visible range, space transmission may be adopted by providing a transmitter and a receiver opposed to each other without using an optical fiber. In this case, if a lens is provided for at least one of the transmission side and the reception side, the transmission distance is increased.

In the case of using an optical fiber, the special direction changes because of a twist of the optical fiber, for example, so that a correspondence between the light-emitting portions and the light-receiving portions cannot be clarified until signal transmission is performed. However, in the case of space transmission, the special direction does not change, so that a correspondence between the light-emitting portions and the light-receiving pats can be established by visual inspection.

Modified Example of Embodiment 3

Figure 18:
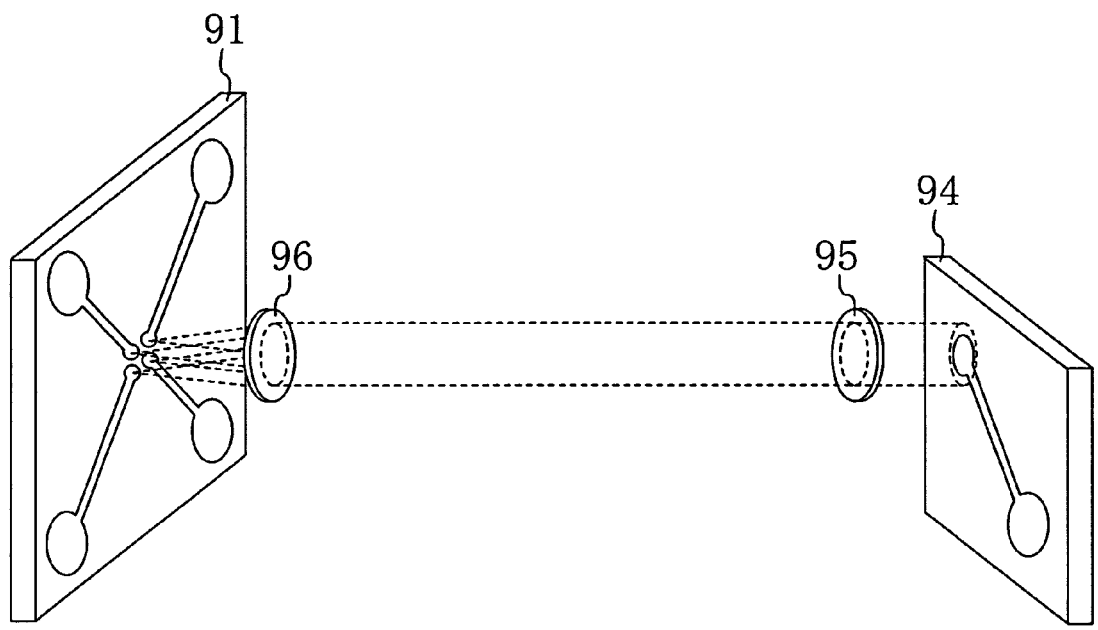
FIG. 18 is a view schematically illustrating an optical communication system according to a modified example of the third embodiment.
Figure 19:
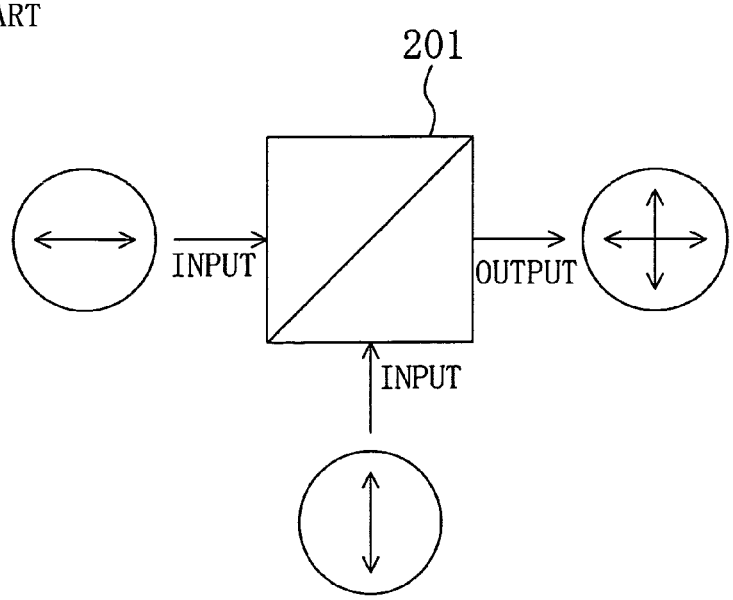
FIG. 19 is a block diagram showing a conventional polarization multiplexing means.

Hereinafter, a modified example of a third embodiment of the present invention will be described with reference to the drawings. FIG. 18 illustrates an optical communication system according to a modified example of the third embodiment. As illustrated in FIG. 18, the optical communication system of this modified example includes: a transmitter 91 including the surface emitting laser of the first embodiment; and a receiver 94 including an analyzer 95 which is rotatably provided. The optical communication system of this modified example is a space-transmission optical communication system in which the transmitter 91 and the receiver 94 are opposed to each other and light-receiving portions of the receiver 94 are directly irradiated with a polarization multiplexed optical signal composed of laser light beams in different linearly polarized light directions emitted from the transmitter 91. In this modified example, a lens 96 for focusing a polarization multiplexed optical signal is provided. However, if the transmitter 91 and the receiver 94 are closely located, the lens 96 is not necessarily provided.

The receiver 94 of this modified example includes only one light-receiving portion. Accordingly, only one channel which has passed through the analyzer 95 is detected out of the polarization multiplexed optical signal. However, the analyzer 95 is rotatably provided, so that each channel is allowed to be detected with time division by rotating the analyzer 95.

As the analyzer 95, a general analyzer can be used. The analyzer 95 may use a metal opening array similar to the metal opening arrays of the first embodiment and the modified examples thereof may be used. For example, a portion with an appropriate size cut out of a metal opening array in which a 113 nm-thick intermediate layer made of $SiO_2$, a 200 nm-thick metal layer made of Ag and including openings arranged at regular intervals and a 200 nm-thick cap layer made of SiN are stacked on a transparent substrate with a diameter of 2 inches may be used.

This modified example is directed to the space-transmission optical communication system. Alternatively, the optical transmission system may be an optical transmission system using an optical fiber similar to that used in the third embodiment.

As described above, according to the present invention, a surface emitting laser capable of emitting a polarization multiplexed optical signal and using a small number of parts without the need for complicated adjustment processes, a photodetector for detecting a signal in a plurality of channels included in the polarization multiplexed optical signal and an optical communication system for polarization division multiplexing using the laser and the receiver are implemented. The present invention is useful for a surface emitting laser and a photodetector for use in optical communication with polarization division multiplexing, and an optical communication system using the laser and the receiver, for example.

What is claimed is:

1. A surface emitting laser, comprising three or more light-emitting portions for emitting laser light in different linearly polarized light directions, the light-emitting portions being formed on a substrate and located close to each other, wherein the light-emitting portions, include respective metal opening arrays each including a metal layer and provided at a light-emitting surface of the light-emitting portion, the metal layer includes a plurality of openings arranged at regular intervals and each having a diameter equal to or smaller than an oscillation wavelength of the laser light, the openings are arranged to form a rectangular lattice having two different lattice pitches P1 and P2, the lattice direction of the rectangular lattice differs among the metal opening arrays, polarized light directions of light beams emitted from the respective light-emitting portions are respectively 0° or more and less than 180° and coincides with a direction of P1, P1 is smaller than P2, P1 satisfies a relationship:

$$0.9 \times P1 \leq \lambda \times (i^2+j^2)^{1/2}/(\epsilon_1\epsilon_2/(\epsilon_1+\epsilon_2))^{1/2} \leq 1.1 \times P1,$$
and P2 does not satisfy a relationship:

$$0.9 \times P2 \leq \lambda \times (i^2+j^2)^{1/2}/(\epsilon_1\epsilon_2/(\epsilon_1+\epsilon_2))^{1/2} \leq 1.1 \times P2$$

where $\epsilon_1$ is a dielectric constant of the metal layer, $\epsilon_2$ is a dielectric constant of a medium in contact with one of an upper surface and a lower surface of the metal layer, λ is an oscillation wavelength of the laser light, and i and j are integers which are not negative.

2. The surface emitting laser of claim 1, wherein the light-emitting portions are formed within a region having a diameter of 100 μm.

3. The surface emitting laser of claim 1, wherein one of the two lattice pitches satisfies a surface plasmon resonance condition with respect to the laser light.

4. The surface emitting laser of claim 1, wherein the substrate has a semi-insulating property, and the light-emitting portions are formed in respective regions which are electrically isolated from one another by a trench formed in the substrate.

5. The surface emitting laser of claim 4, wherein each of the light-emitting portions includes: a stack of a plurality of semiconductor layers formed on the substrate; and two electrodes for applying a voltage to the stack of semiconductor layers, and the two electrodes are formed at one side of the substrate.

6. A photodetector, comprising:

a substrate; and three or more light-receiving portions formed on the substrate and located close to each other, wherein the light-receiving portions include respective metal opening arrays each including a metal layer and provided at the light-receiving surface of the light-receiving portion, the metal layer includes a plurality of openings arranged at regular intervals and each having a diameter equal to or smaller than an oscillation wavelength of the laser light, the openings are arranged to form a rectangular lattice having two different lattice pitches P1 and P2, the lattice direction of the rectangular lattice differs among the metal opening arrays, each of the light-receiving portions detects, as detected light, light in a linearly polarized light direction which coincides with a direction of P1, out of light incident on light-receiving surfaces of the respective light-receiving portions, P1 is smaller than P2, P1 satisfies a relationship:

$$0.9 \times P1 \leq \lambda \times (i^2+j^2)^{1/2}/(\epsilon_1\epsilon_2/(\epsilon_1+\epsilon_2))^{1/2} \leq 1.1 \times P1,$$
and P2 does not satisfy a relationship:

$$0.9 \times P2 \leq \lambda \times (i^2+j^2)^{1/2}/(\epsilon_1\epsilon_2/(\epsilon_1+\epsilon_2))^{1/2} \leq 1.1 \times P2$$

where $\epsilon_1$ is a dielectric constant of the metal layer, $\epsilon_2$ is a dielectric constant of a medium in contact with one of an upper surface and a lower surface of the metal layer, λ is an oscillation wavelength of the laser light, and i and j are integers which are not negative.

7. The photodetector of claim 6, wherein the light-receiving portions are formed within a region having a diameter of 100 μm.

8. The photodetector of claim 6, wherein one of the two lattice pitches satisfies a surface plasmon resonance condition with respect to the detected light.

9. The photodetector of claim 6, wherein the substrate has a semi-insulating property, and the light-receiving portions are formed in respective regions which are electrically isolated from one another by a trench formed in the substrate.

10. The photodetector of claim 9, wherein each of the light-receiving portions is a photodiode formed on the substrate and including two electrodes, and the two electrodes are formed at one side of the substrate.

11. An optical communication system, comprising:

a transmitter including the surface emitting laser of claim 1 and configured to output a polarization multiplexed optical signal in multiple channels composed of a plurality of laser light beams in different linearly polarized light directions emitted from respective light-emitting portions of the surface emitting laser; and a receiver for detecting the polarization multiplexed optical signal in multiple channels with the polarization multiplexed optical signal being divided into portions corresponding to the respective channels.

12. The optical communication system of claim 11, wherein the receiver includes the photodetector of claim 16.

13. The optical communication system of claim 11, wherein the receiver includes:

an analyzer rotatably provided and allowing only a light beam in a specific linearly polarized light direction to pass therethrough depending on an angle of rotation; and a light-receiving portion for detecting the light beam which has passed through the analyzer.

14. The optical communication system of claim 13, wherein the analyzer includes a metal opening array including a metal film, and a plurality of openings each having a width in a direction orthogonal to a longitudinal direction equal to or smaller than a wavelength of the polarization multiplexed optical signal are formed in the metal film in such a manner that the directions of the respective openings orthogonal to the longitudinal directions thereof are oriented in one direction.

15. The optical communication system of claim 11, further comprising an optical fiber for transmitting the polarization multiplexed optical signal to the receiver with the linearly polarized light directions of the polarization multiplexed optical signal preserved.

16. The optical communication system of claim 15, wherein a plurality of laser light beams emitted from the respective light-emitting portions are directly coupled to the optical fiber.

17. The optical communication system of claim 11, wherein the polarization multiplexed optical signal is transmitted to the receiver by space transmission.

18. The optical communication system of claim 17, further comprising a lens for focusing the polarization multiplexed optical signal output from the transmitter.

* * * * *